(12) United States Patent
Madduri et al.

(10) Patent No.: US 10,763,891 B2
(45) Date of Patent: *Sep. 1, 2020

(54) FLOATING POINT TO FIXED POINT CONVERSION

(71) Applicant: Intel Corporation, Santa Clara, CA (US)

(72) Inventors: Venkateswara Madduri, Austin, TX (US); Elmoustapha Ould-Ahmed-Vall, Chandler, AZ (US); Robert Valentine, Kiryat Tivon (IL); Jesus Corbal, King City, OR (US); Mark Charney, Lexington, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/291,231

(22) Filed: Mar. 4, 2019

(65) Prior Publication Data

US 2019/0199370 A1 Jun. 27, 2019

Related U.S. Application Data

(63) Continuation of application No. 15/721,573, filed on Sep. 29, 2017, now Pat. No. 10,224,954.

(51) Int. Cl.
*H03M 7/24* (2006.01)
*H03M 7/40* (2006.01)
*H03M 7/42* (2006.01)

(52) U.S. Cl.
CPC ............. *H03M 7/24* (2013.01); *H03M 7/40* (2013.01); *H03M 7/42* (2013.01)

(58) Field of Classification Search
None
See application file for complete search history.

(56) References Cited

U.S. PATENT DOCUMENTS

| 4,805,128 A | 2/1989 | Nelsen et al. |
| 5,561,615 A | 10/1996 | Kuo et al. |
| 7,216,138 B2 | 5/2007 | Abdallah et al. |
| 10,223,114 B1 * | 3/2019 | Madduri ............... G06F 7/483 |

(Continued)

OTHER PUBLICATIONS

Notice of Allowance from U.S. Appl. No. 15/721,573, dated Oct. 19, 2018, 6 pages.

*Primary Examiner* — Michael D. Yaary
(74) *Attorney, Agent, or Firm* — Nicholson De Vos Webster & Elliott LLP

(57) ABSTRACT

Embodiments of an instruction, its operation, and executional support for the instruction are described. In some embodiments, a processor comprises decode circuitry to decode an instruction having fields for an opcode, a packed data source operand identifier, and a packed data destination operand identifier; and execution circuitry to execute the decoded instruction to convert a single precision floating point data element of a least significant packed data element position of the identified packed data source operand to a fixed-point representation, store the fixed-point representation as 32-bit integer and a 32-bit integer exponent in the two least significant packed data element positions of the identified packed data destination operand, and zero of all remaining packed data elements of the identified packed data destination operand.

20 Claims, 16 Drawing Sheets

(56) References Cited

U.S. PATENT DOCUMENTS

| | | | |
|---|---|---|---|
| 10,224,954 B1* | 3/2019 | Madduri | H03M 7/24 |
| 2004/0128331 A1 | 7/2004 | Hinds et al. | |
| 2011/0153991 A1 | 6/2011 | Busaba et al. | |
| 2015/0039661 A1* | 2/2015 | Blomgren | H03M 7/24 708/204 |
| 2018/0052660 A1 | 2/2018 | Lutz et al. | |
| 2018/0157464 A1 | 6/2018 | Lutz et al. | |
| 2019/0199370 A1* | 6/2019 | Madduri | H03M 7/24 |

* cited by examiner

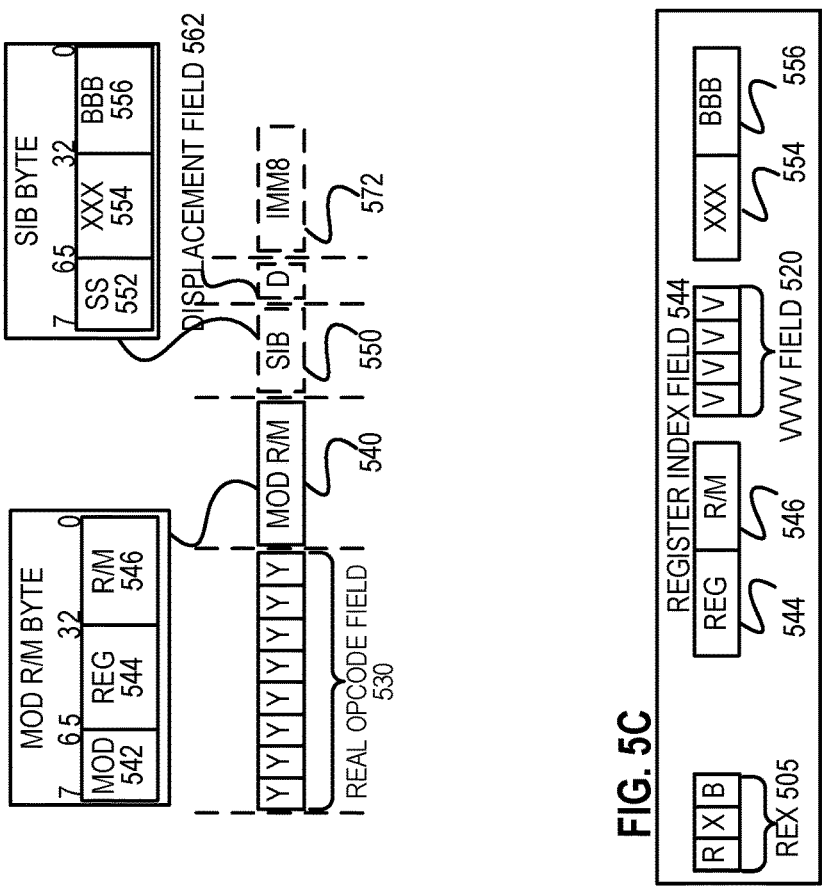
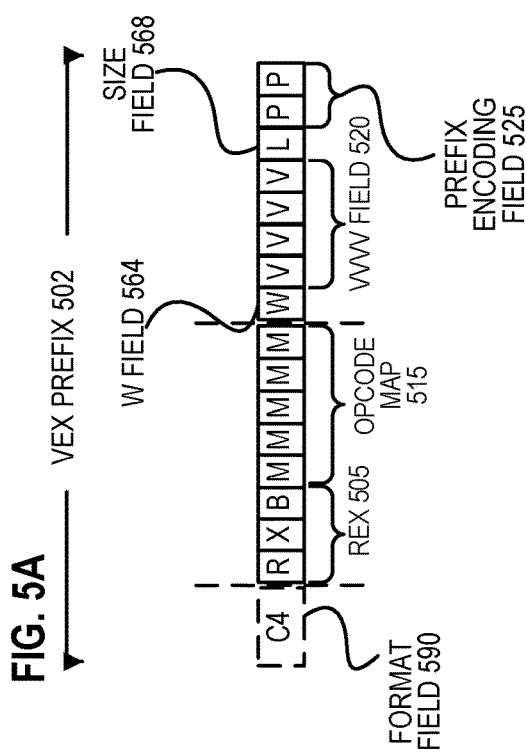
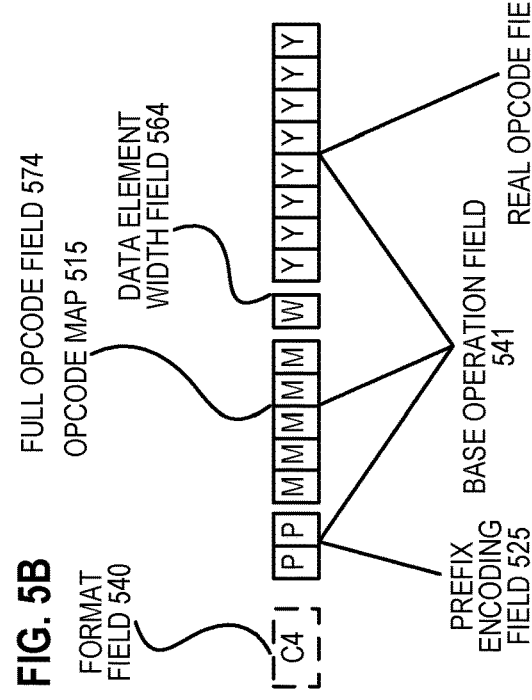

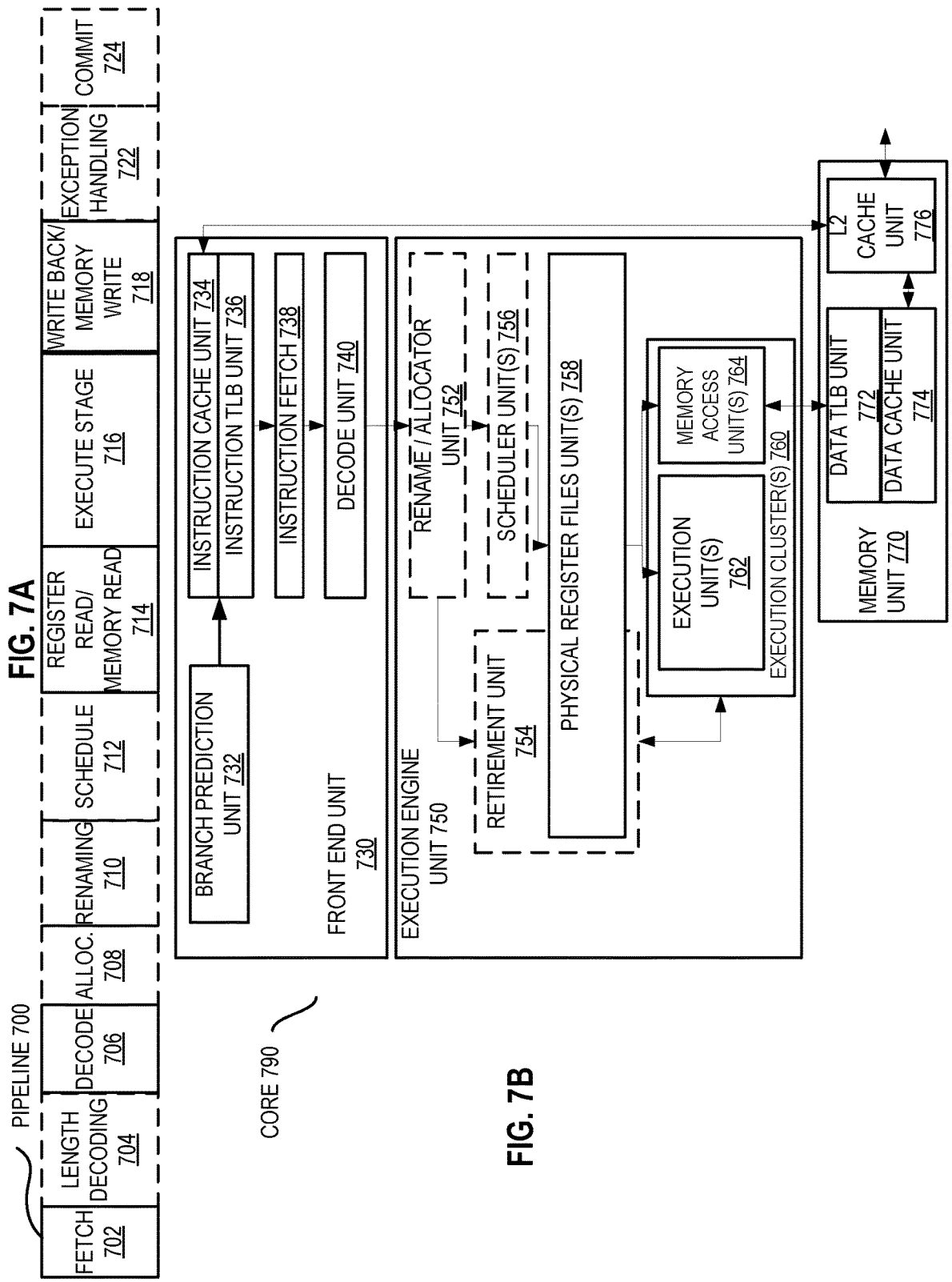

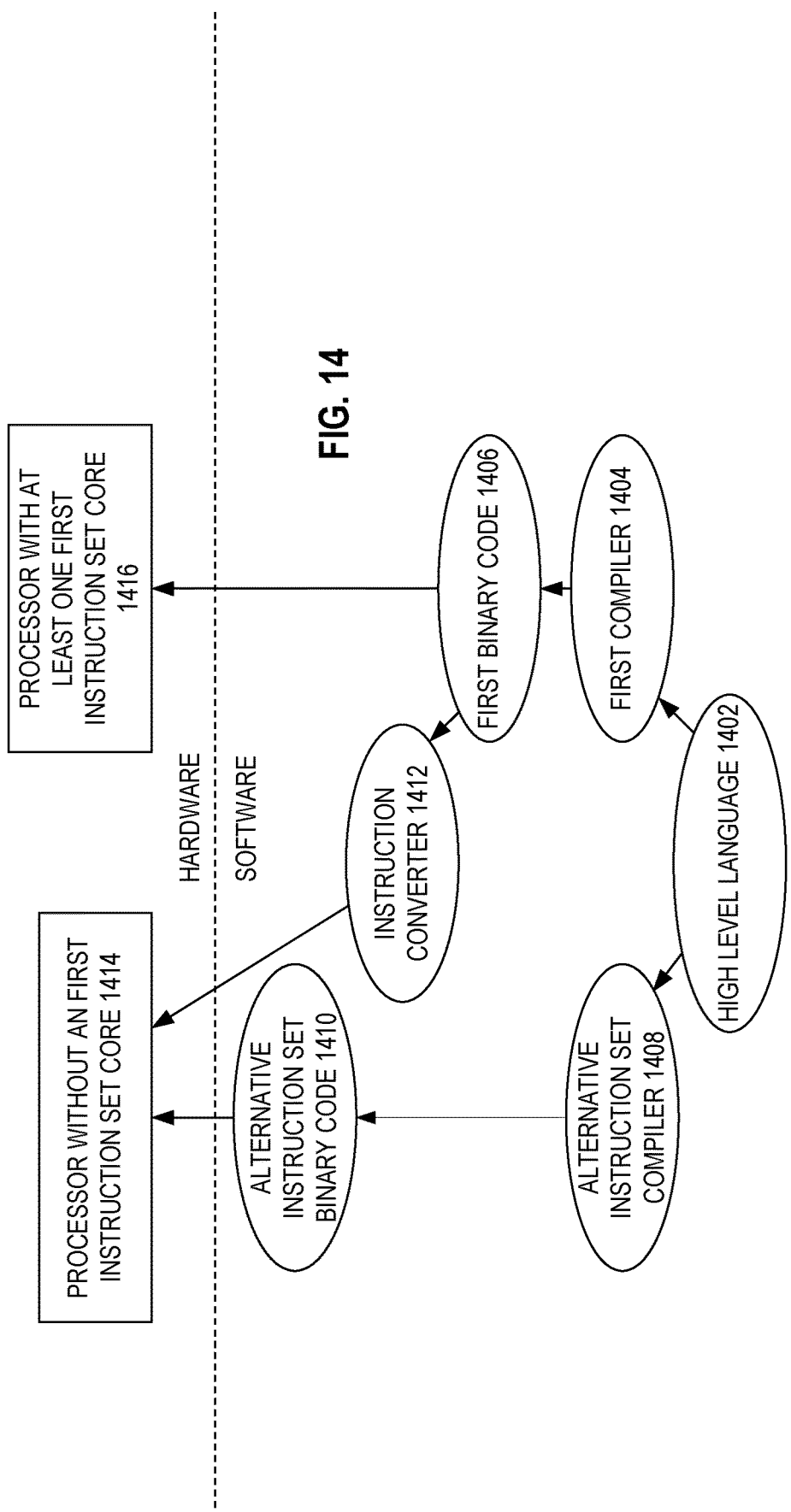

```
// DECONSTRUCT FLOATING POINT VALUE
SIGN            ← SRC1[31];
EXPONENT[7:0]   ← SRC1[30:23];
FRACTIONAL[22:0] ← SRC1[22:0];
IF(EXPONENT[7:0] == 8'B0000_0000)
        INTEGER32VAL[31:0] ← 32'H0000_0000;
        INTEXPONENT[31:0]  ← 32'H0000_0000;
ELSEIF(EXPONENT[7:0] == 8'B1111_1111)
        IF(FRACTIONAL == 23'B0)
                IF(SIGN == 1'B0)
                        INTEGER32VAL[31:0] ← 32'H7FFF_FFFF;
                        INTEXPONENT [31:0] ← 32'H7FFF_FFFF;
                ELSE
                        INTEGER32VAL[31:0] ← 32'H8000_0000; (* MAXIMUM NEGATIVE NUMBER *)
                        INTEXPONENT [31:0] ← 32'H7FFF_FFFF; (* MOST POSITIVE *)
        ELSE
                INTEGER32VAL[31:0] ← 32'H0000_0000;
                INTEXPONENT [31:0] ← 32'H7FFF_FFFF; (* MOST POSITIVE *)
ELSE
        ABSINTEGER32VAL[31:0] ← {8'B0, 1'B1, FRACTIONAL[22:0]};
        IF( SIGN == 1'B0)
                INTEGER32VAL[31:0] ← ABSINTEGER32VAL[31:0];
        ELSE
                INTEGER32VAL[31:0] ← ~ABSINTEGER32VAL[31:0] + 1'B1;
        TEMP[8:0] = {1'B0, EXPONENT[7:0] } + 9'B1_0110_1010 // UNSIGNED ADDITION
        INTEXPONENT[31:0] ← {23{TEMP[8]},TEMP[8:0] }; // SIGNED NUMBER
DEST[31:0]   ← INTEGER32VAL[31:0];
DEST[63:32]  ← INTEXPONENT [31:0];
DEST[127:64] ← 0;
```

FIG. 15

FLOATING POINT TO FIXED POINT CONVERSION

BACKGROUND

There are many different ways to express a number in a computer processor. For example, a whole number may be represented as an integer value. Fractions and other non-integer values may be represented as a fixed-point number with a number of bits used for the integer component and a number of bits used for the fractional part (e.g., INTEGER.FRACTION). Another way to represent fractions is using a floating point number which includes bits for a sign, a digit string (mantissa, fractional, or significand)—the length of which determines the precision of the number, and an exponent indicating a location of the decimal place.

BRIEF DESCRIPTION OF THE DRAWINGS

The present invention is illustrated by way of example and not limitation in the figures of the accompanying drawings, in which like references indicate similar elements and in which:

FIG. 5A illustrates an exemplary instruction format;

FIG. 5B illustrates which fields from FIG. 5A make up a full opcode field and a base operation field;

FIG. 5C illustrates which fields from FIG. 5A make up a register index field;

FIG. 7A is a block diagram illustrating both an exemplary in-order pipeline and an exemplary register renaming, out-of-order issue/execution pipeline according to embodiments of the invention;

FIG. 7B is a block diagram illustrating both an exemplary embodiment of an in-order architecture core and an exemplary register renaming, out-of-order issue/execution architecture core to be included in a processor according to embodiments of the invention;

FIG. 14 is a block diagram contrasting the use of a software instruction converter to convert binary instructions in a source instruction set to binary instructions in a target instruction set according to embodiments of the invention; and FIG. 15 is an embodiment of pseudocode representing the operations of the described instruction.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

At times, it is beneficial to move from one data type (e.g., fixed-point) to another data type (e.g., floating point). Detailed herein are instructions to convert a single precision floating point value from a packed data operand (e.g., single instruction, multiple data (SIMD) or vector register) to a fixed-point value and store the value in a packed data operand. Depending upon the implementation, the instructions detailed herein may use packed data register operands of different sizes (e.g., 128-bit, 256-bit, 512-bit registers, etc.) and/or utilize at least a memory location for the source of the instruction. This instruction is an improvement to a computer itself as it provides support for a conversion of a particular data element which has not previously been performed. In particular, an execution of a floating point to fixed-point convert instruction causes a conversion of a single precision floating point data element of a least significant packed data element position of an identified packed data source operand to a fixed-point representation, storage of the fixed-point representation as 32-bit integer and a 32-bit integer exponent in the two least significant packed data element positions of an identified packed data destination operand, and zeroing of all remaining packed data elements of the identified packed data destination operand.

Figure 1:
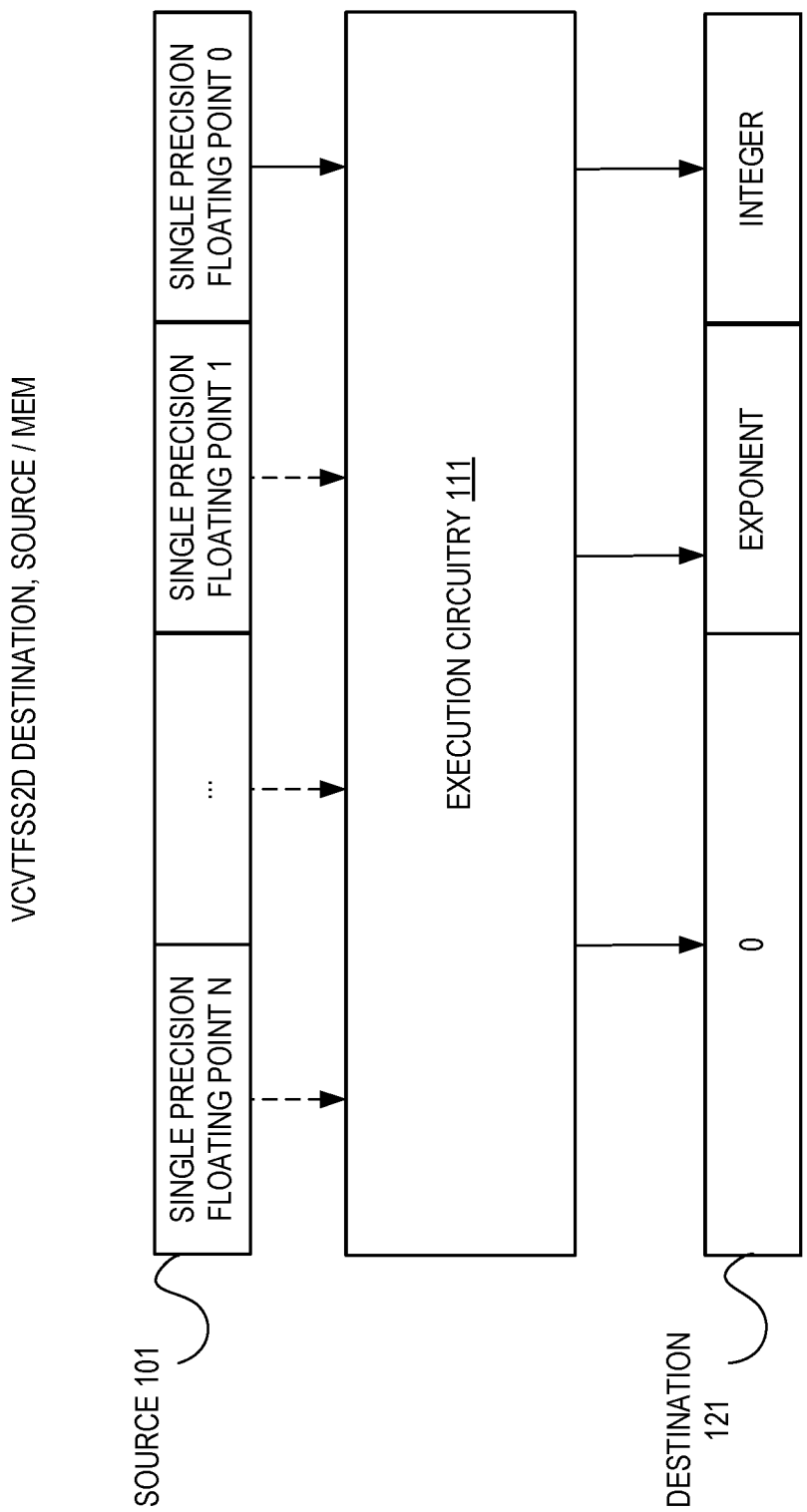
FIG. 1 illustrates an embodiment of a selected portion of execution of a fixed-point to floating point convert instruction having a source operand (either register or memory) and a destination operand.

FIG. 1 illustrates an embodiment of a selected portion of execution of a fixed-point to floating point convert instruction having a source operand (either register or memory) and a destination operand. The format of this instruction includes fields for an opcode ("VCTFSS2D" is the opcode mnemonic in this illustration), a packed data source operand identifier (shown as "SOURCE/MEM"), and a packed data destination operand identifier (shown as "DESTINATION").

The packed data source operand field represents either a register location of packed data or a memory location for packed data, wherein one single precision floating point value of that packed data is to be converted from floating point to a fixed-point value (two 32-bit values).

The packed data destination operand field represents a register location of packed data, wherein the result of the conversion (a fixed-point value) is to be stored.

In the illustrated example, the identified source operand 101 has a plurality of single precision floating point elements. A single precision floating point element in the least significant position is single precision floating point element 0 and the most significant position is single precision floating point element N. The number of single precision floating point elements is dependent upon the size of the identified source operand 101 (e.g., 128-bit, 256-bit, 512-bit, etc.).

Execution circuitry 111 takes the single precision floating point value from the least significant packed data element position of the identified source operand 101 and converts the value into a fixed-point value. The fixed-point value comprises a 32-bit integer component and a 32-bit exponent component. A more detailed execution flow is detailed later.

The fixed-point value is then stored in the identified destination operand 121 in consecutive least significant data element positions and all other data element positions are set to 0. While the integer component is shown as being stored in the least significant position, in some embodiments, the order is flipped with the exponent being stored in the least significant position.

Figure 2:
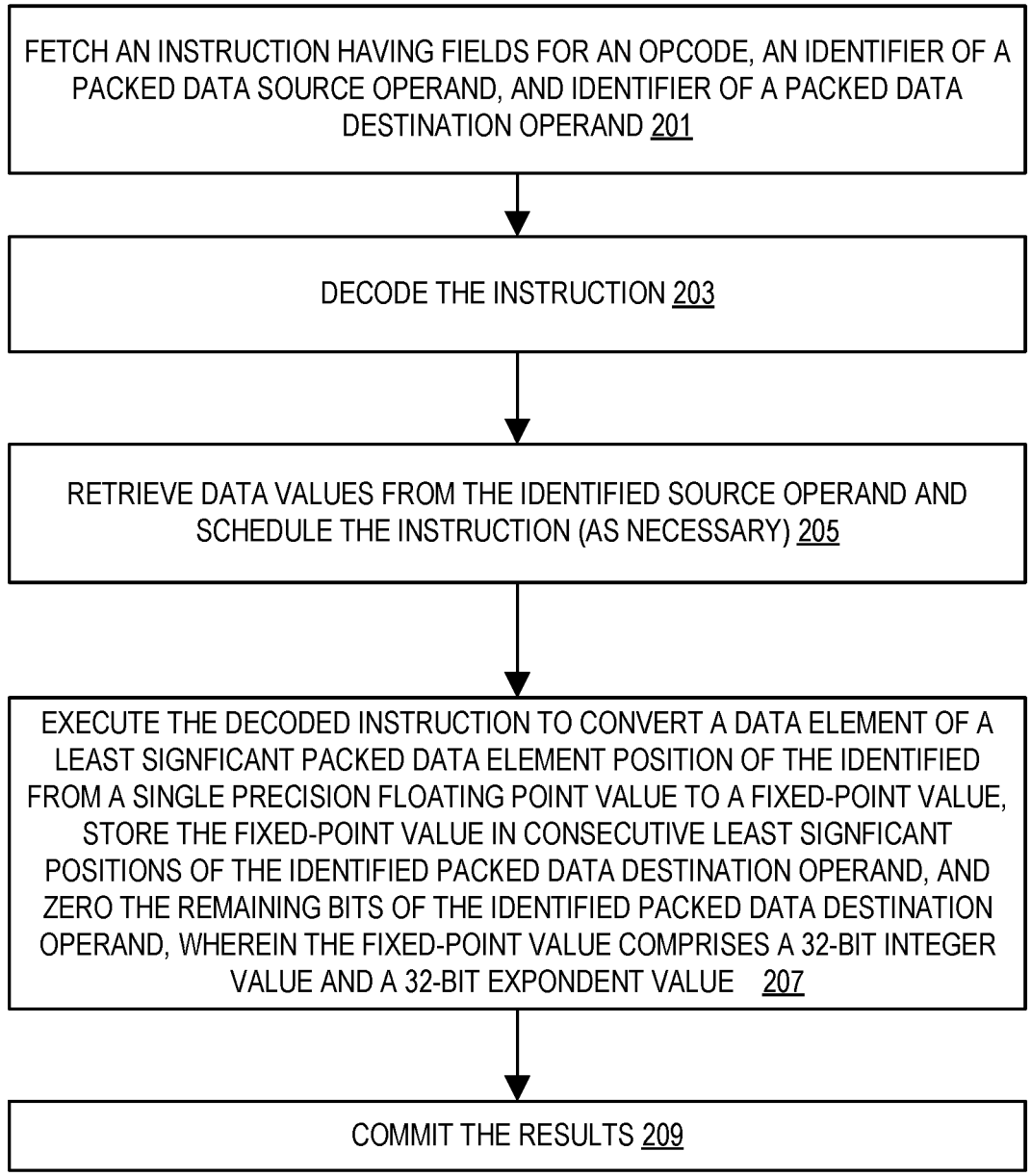
FIG. 2 illustrates an embodiment of method performed by a processor to process a floating point to fixed-point convert instruction.

FIG. 2 illustrates an embodiment of method performed by a processor to process a floating point to fixed-point convert instruction.

At 201, an instruction is fetched. For example, a floating point to fixed-point convert instruction is fetched. The floating point to fixed-point convert instruction includes fields for an opcode, a packed data source operand identifier, and a packed data destination operand identifier. In some embodiments, the instruction is fetched from an instruction cache.

The fetched instruction is decoded at 203. For example, the fetched floating point to fixed-point convert instruction is decoded by decode circuitry such as that detailed herein.

Data values associated with the identified source operand of the decoded instruction are retrieved at 205 and the decoded instruction is scheduled (as needed). For example, when an identified source operand is a memory operand, the data from the indicated memory location is retrieved.

At 207, the decoded instruction is executed by execution circuitry (hardware) such as that detailed herein. For the floating point to fixed-point convert instruction, the execution will cause execution circuitry to convert a single precision floating point data element of a least significant packed data element position of an identified packed data source operand to a fixed-point representation, store the fixed-point representation as a 32-bit integer and a 32-bit integer exponent in the two least significant packed data element positions of an identified packed data destination operand, and zero all remaining packed data elements of the identified packed data destination operand.

In some embodiments, the instruction is committed or retired at 209.

Figure 3A:
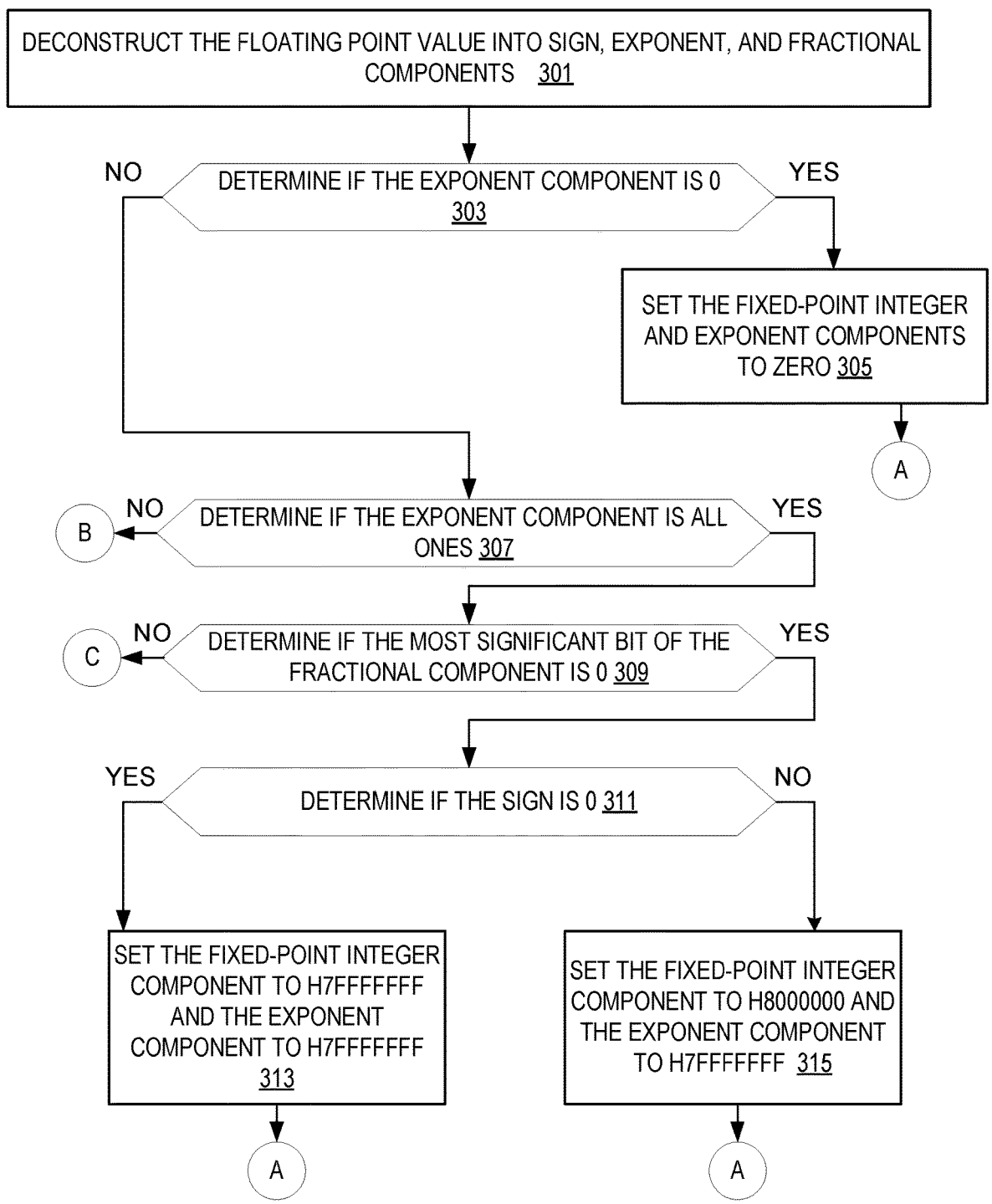
FIGS. 3(A)-(B) illustrate a more detailed description of a method of execution of a convert an unsigned word from fixed-point to floating point instruction.
Figure 3B:
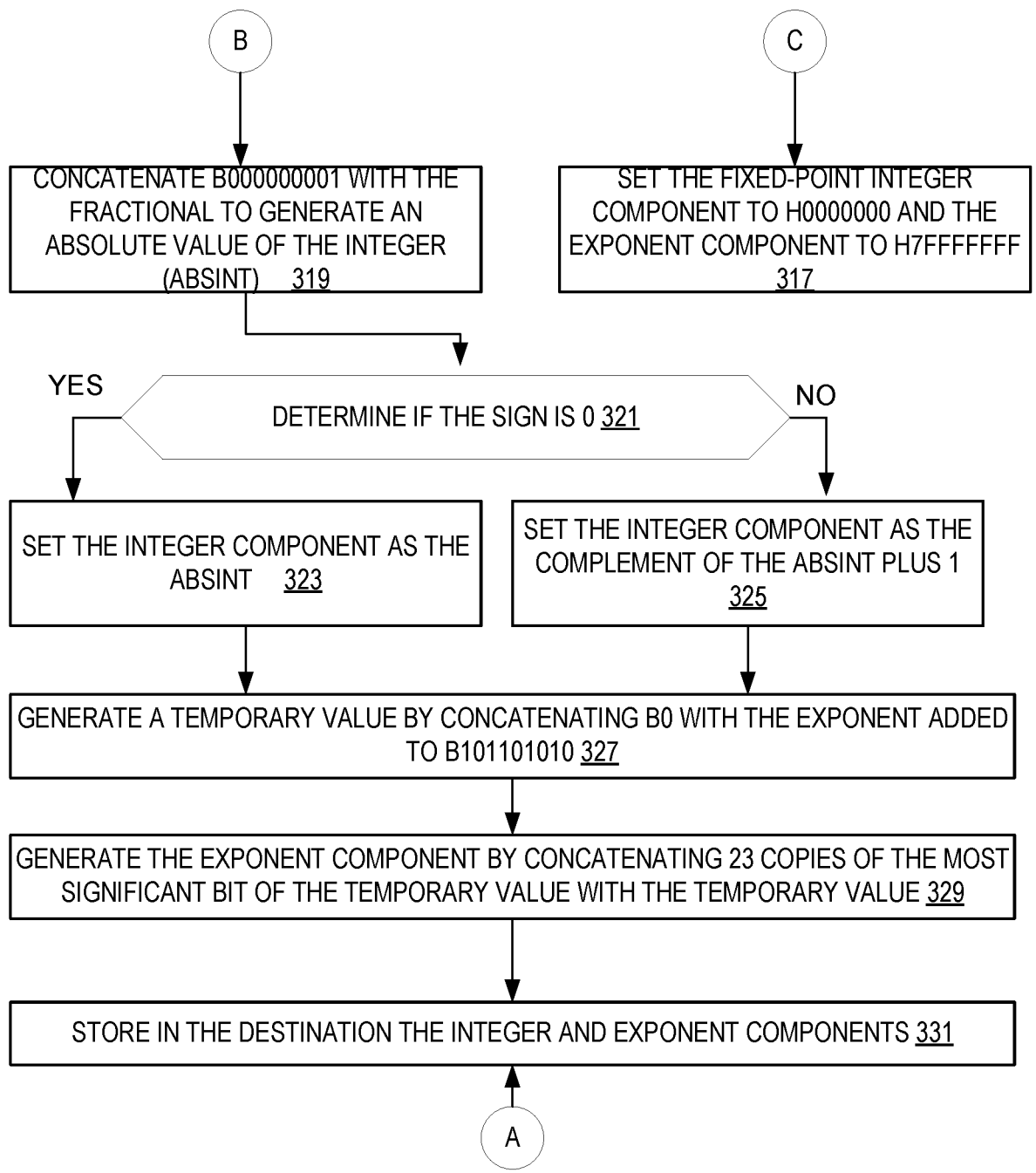

FIGS. 3(A)-(B) illustrate a more detailed description of a method of execution of a convert an unsigned word from fixed-point to floating point instruction. Typically, this is performed by execution circuitry such as that detailed above. In some embodiments, the circuitry performs this method as a state machine.

At 301, the floating point value is deconstructed into sign, exponent, and fractional components. For example, sign←SRC1[31], exponent[7:0]←F SRC1[30:23], fractional[22:0]←SRC1[22:0].

At 303, a determination of whether the exponent component is 0 is made. For example, is exponent [7:0]==8'b00000000?

When the exponent component is 0, the fixed-point integer and exponent components are set to zero at 305. For example, integer32Val[31:0]←32'h00000000 and intExponent[31:0]←32'h00000000.

When the exponent component is not 0, a determination of whether the exponent component is all ones is made at 307.

When the exponent component is all ones, a determination of whether the most significant bit of the fractional component is 0 is made at 309.

When the most significant bit of the fractional component is 0, a determination of whether the sign is 0 is made at 311. When the sign is 0, the fixed-point integer component is set to a value corresponding to hexadecimal 7ffffff and the exponent component is set to a value corresponding to hexadecimal 7fffffff at 313. For example, integer32Val[31:0]←32'h7fff_ffff and intExponent [31:0]←32'h7fff_ffff.

When the sign is not 0, the fixed-point integer component is set to a value corresponding to hexadecimal 8000000 and the exponent component is set to a value corresponding to hexadecimal 7fffffff at 315. For example, integer32Val[31:0]←32'h800_0000 and intExponent [31:0]←32'h7fff_ffff.

When the most significant bit of the fractional component is not 0, the fixed-point integer component to a value corresponding to h0000000 and the exponent component is set to a value corresponding to h7fffffff at 317. For example, integer32Val[31:0]←32'h000_0000 and intExponent [31:0]←32'h7fff_ffff.

When the exponent component is not all ones or zeros, b000000001 is concatenated with the fractional component to generate an absolute value of the integer at 319. For example, absInteger32Val[31:0]←{8'b0, 1'b1, fractional[22:0]}. This preserves 24-bit precision.

At 321, a determination of whether the sign is 0 is made. In other words, the sign is applied.

When the sign is 0, the integer component is set as the absolute value of the integer at 323. For example, integer32Val[31:0]←absInteger32Val[31:0];

When the sign is not 0, the integer component is set as the complement of the absolute value of the integer plus 1 at 325. For example, integer32Val[31:0]←~absInteger32Val [31:0]+1'b1. In some embodiments, the user is allowed to decide on precision loss.

At 327, a temporary value is generated by concatenating b0 with the exponent added to b101101010 (e.g., temp[8:0]={1'b0, exponent[7:0]}+9'b1_0110_1010).

The exponent component is generated by concatenating 23 copies of the most significant bit of the temporary value with the temporary value at 329 (e.g., intExponent [31:0]←{23{temp[8]}, temp[8:0]}).

At 331, the generated integer and exponent components are stored (and the remaining data elements are set to zero).

Figure 4:
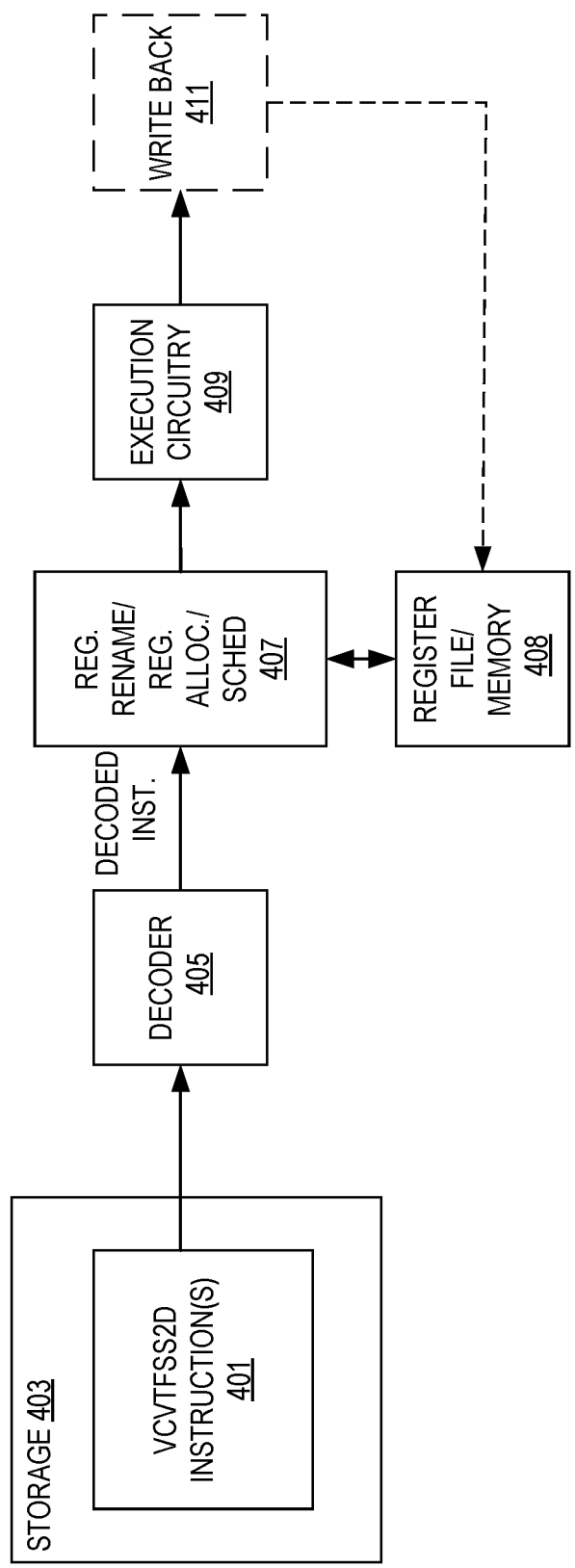
FIG. 4 illustrates an embodiment of hardware to process an instruction such as the instruction detailed herein.

FIG. 4 illustrates an embodiment of hardware to process an instruction such as the instruction detailed herein. As illustrated, storage 403 stores a VCVTFSS2D instruction 401 to be executed.

The instruction 401 is received by decode circuitry 405. For example, the decode circuitry 405 receives this instruction from fetch logic/circuitry. The instruction includes fields for an opcode, a source identifier, and a destination identifier. In some embodiments, the source and destination are registers, and in other embodiments one or both are memory locations.

More detailed embodiments of at least one instruction format will be detailed later. The decode circuitry 405 decodes the instruction into one or more operations. In some embodiments, this decoding includes generating a plurality of micro-operations to be performed by execution circuitry (such as execution circuitry 409). The decode circuitry 405 also decodes instruction prefixes.

In some embodiments, register renaming, register allocation, and/or scheduling circuitry 407 provides functionality for one or more of: 1) renaming logical operand values to physical operand values (e.g., a register alias table in some embodiments), 2) allocating status bits and flags to the decoded instruction, and 3) scheduling the decoded instruction for execution on execution circuitry out of an instruction pool (e.g., using a reservation station in some embodiments).

Registers (register file) and/or memory 408 store data as operands of the instruction to be operated on by execution circuitry 409. Exemplary register types include packed data registers, general purpose registers, and floating point registers.

Execution circuitry 409 executes the decoded instruction. The execution of the decoded instruction causes the execution circuitry to convert a data element of a least significant packed data element position of the identified packed data source operand from a floating point representation to a fixed-point representation, store the fixed-point representation into consecutive least significant packed data element positions of the identified packed data destination operand, and zero all remaining packed data elements of the identified packed data destination operand.

In some embodiments, retirement/write back circuitry 411 architecturally commits the destination register into the registers or memory 408 and retires the instruction.

FIG. 15 is an embodiment of pseudocode representing the operations of the described instruction.

An embodiment of a format for the floating point to fixed-point convert instruction is VCVTFSS2D DST, SRC/MEM. VCVTFSS2D is the opcode of the instruction. Exemplary opcode mnemonics have been detailed above. DST is a field identifying a destination operand. SRC1 is a field for a source operand identifier such as a register and/or memory location. In some embodiments, the operand fields are encoded using VVVV field 520, MOD R/M 540, and/or SIB 550.

In embodiments, encodings of the instruction include a scale-index-base (SIB) type memory addressing operand that indirectly identifies multiple indexed destination locations in memory (e.g., field 550). In one embodiment, an SIB type memory operand may include an encoding identifying a base address register. The contents of the base address register may represent a base address in memory from which the addresses of the particular destination locations in memory are calculated. For example, the base address may be the address of the first location in a block of potential destination locations for an extended vector instruction. In one embodiment, an SIB type memory operand may include an encoding identifying an index register. Each element of the index register may specify an index or offset value usable to compute, from the base address, an address of a respective destination location within a block of potential destination locations. In one embodiment, an SIB type memory operand may include an encoding specifying a scaling factor to be applied to each index value when computing a respective destination address. For example, if a scaling factor value of four is encoded in the SIB type memory operand, each index value obtained from an element of the index register may be multiplied by four and then added to the base address to compute a destination address.

In one embodiment, an SIB type memory operand of the form vm32{x,y,z} may identify a vector array of memory operands specified using SIB type memory addressing. In this example, the array of memory addresses is specified using a common base register, a constant scaling factor, and a vector index register containing individual elements, each of which is a 32-bit index value. The vector index register may be a 128-bit (e.g., XMM) register (vm32x), a 256-bit (e.g., YMM) register (vm32y), or a 512-bit (e.g., ZMM) register (vm32z). In another embodiment, an SIB type memory operand of the form vm64{x,y,z} may identify a vector array of memory operands specified using SIB type memory addressing. In this example, the array of memory addresses is specified using a common base register, a constant scaling factor, and a vector index register containing individual elements, each of which is a 64-bit index value. The vector index register may be a 128-bit (e.g., XMM) register (vm64x), a 256-bit (e.g., YMM) register (vm64y) or a 512-bit (e.g., ZMM) register (vm64z).

Detailed below are exemplary instruction formats, architectures, and systems that may be utilized for the above detailed instructions. For example, an exemplary pipeline supporting the instructions is detailed that includes circuitry to perform the methods detailed herein.

An instruction set includes one or more instruction formats. A given instruction format defines various fields (number of bits, location of bits) to specify, among other things, the operation to be performed (opcode) and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands.

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

VEX Instruction Format

VEX encoding allows instructions to have more than two operands, and allows SIMD vector registers to be longer than 58 bits. The use of a VEX prefix provides for three-operand (or more) syntax. For example, previous two-operand instructions performed operations such as A=A+B, which overwrites a source operand. The use of a VEX prefix enables operands to perform nondestructive operations such as A=B+C.

FIG. 5A illustrates an exemplary instruction format including a VEX prefix 502, real opcode field 530, Mod R/M byte 540, SIB byte 550, displacement field 562, and IMM8 572. FIG. 5B illustrates which fields from FIG. 5A make up a full opcode field 574 and a base operation field 541. FIG. 5C illustrates which fields from FIG. 5A make up a register index field 544.

VEX Prefix (Bytes 0-2) 502 is encoded in a three-byte form. The first byte is the Format Field 590 (VEX Byte 0, bits [7:0]), which contains an explicit C4 byte value (the unique value used for distinguishing the C4 instruction format). The second-third bytes (VEX Bytes 1-2) include a number of bit fields providing specific capability. Specifically, REX field 505 (VEX Byte 1, bits [7-5]) consists of a VEX.R bit field (VEX Byte 1, bit [7]-R), VEX.X bit field (VEX byte 1, bit [6]-X), and VEX.B bit field (VEX byte 1, bit[5]-B). Other fields of the instructions encode the lower three bits of the register indexes as is known in the art (rrr, xxx, and bbb), so that Rrrr, Xxxx, and Bbbb may be formed by adding VEX.R, VEX.X, and VEX.B. Opcode map field 515 (VEX byte 1, bits [4:0]-mmmmm) includes content to encode an implied leading opcode byte. W Field 564 (VEX byte 2, bit [7]-W)—is represented by the notation VEX.W, and provides different functions depending on the instruction. The role of VEX.vvvv 520 (VEX Byte 2, bits [6:3]-vvvv) may include the following: 1) VEX.vvvv encodes the first source register operand, specified in inverted (1 s complement) form and is valid for instructions with 2 or more source operands; 2) VEX.vvvv encodes the destination register operand, specified in 1 s complement form for certain vector shifts; or 3) VEX.vvvv does not encode any operand, the field is reserved and should contain 1111b. If VEX.L 568 Size field (VEX byte 2, bit [2]-L)=0, it indicates 58 bit vector; if VEX.L=1, it indicates 256 bit vector. Prefix encoding field 525 (VEX byte 2, bits [1:0]-pp) provides additional bits for the base operation field 541.

Real Opcode Field 530 (Byte 3) is also known as the opcode byte. Part of the opcode is specified in this field.

MOD R/M Field 540 (Byte 4) includes MOD field 542 (bits [7-6]), Reg field 544 (bits [5-3]), and R/M field 546 (bits [2-0]). The role of Reg field 544 may include the following: encoding either the destination register operand or a source register operand (the rrr of Rrrr), or be treated as an opcode extension and not used to encode any instruction operand. The role of R/M field 546 may include the following: encoding the instruction operand that references a memory address, or encoding either the destination register operand or a source register operand.

Scale, Index, Base (SIB)—The content of Scale field 550 (Byte 5) includes SS552 (bits [7-6]), which is used for memory address generation. The contents of SIB.xxx 554 (bits [5-3]) and SIB.bbb 556 (bits [2-0]) have been previously referred to with regard to the register indexes Xxxx and Bbbb.

The Displacement Field 562 and the immediate field (IMM8) 572 contain data.

Exemplary Register Architecture

Figure 6:
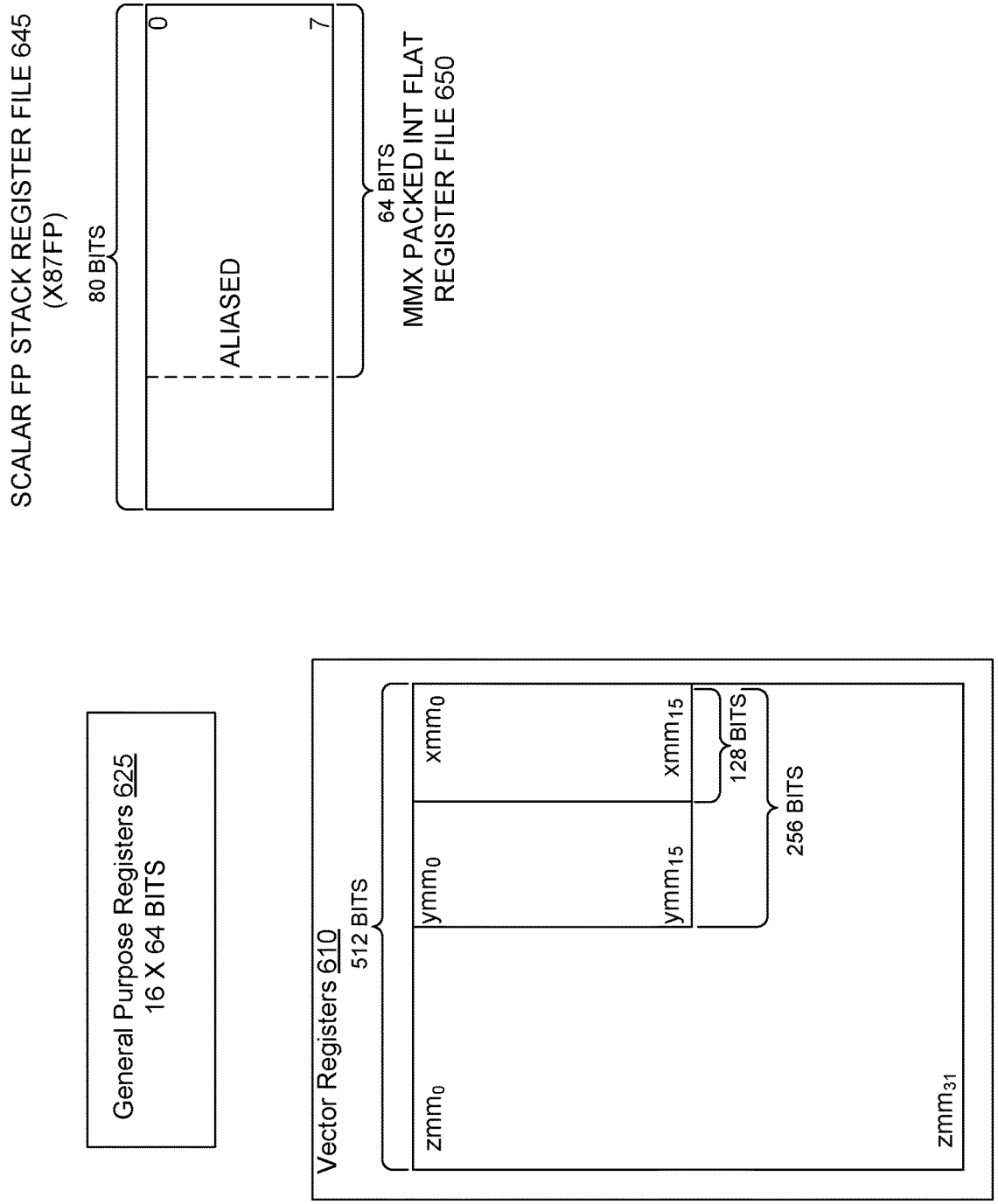
FIG. 6 is a block diagram of a register architecture according to one embodiment of the invention.

FIG. 6 is a block diagram of a register architecture 600 according to one embodiment of the invention. In the embodiment illustrated, there are 32 vector registers 610 that are 512 bits wide; these registers are referenced as zmm0 through zmm31. The lower order 256 bits of the lower 9 zmm registers are overlaid on registers ymm0-15. The lower order 128 bits of the lower 9 zmm registers (the lower order 128 bits of the ymm registers) are overlaid on registers xmm0-15.

General-purpose registers 625—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 645, on which is aliased the MMX packed integer flat register file 650—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures. Detailed herein are circuits (units) that comprise exemplary cores, processors, etc.

Exemplary Core Architectures

In-Order and Out-of-Order Core Block Diagram

FIG. 7A is a block diagram illustrating both an exemplary in-order pipeline and an exemplary register renaming, out-of-order issue/execution pipeline according to embodiments of the invention. FIG. 7B is a block diagram illustrating both an exemplary embodiment of an in-order architecture core and an exemplary register renaming, out-of-order issue/execution architecture core to be included in a processor according to embodiments of the invention. The solid lined boxes in FIGS. 7A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 7A, a processor pipeline 700 includes a fetch stage 702, a length decode stage 704, a decode stage 706, an allocation stage 708, a renaming stage 710, a scheduling (also known as a dispatch or issue) stage 712, a register read/memory read stage 714, an execute stage 716, a write back/memory write stage 718, an exception handling stage 722, and a commit stage 724.

FIG. 7B shows processor core 790 including a front end unit 730 coupled to an execution engine unit 750, and both are coupled to a memory unit 770. The core 790 may be a reduced instruction set computing (RISC) core, a complex instruction set computing (CISC) core, a very long instruction word (VLIW) core, or a hybrid or alternative core type. As yet another option, the core 790 may be a special-purpose core, such as, for example, a network or communication core, compression engine, coprocessor core, general purpose computing graphics processing unit (GPGPU) core, graphics core, or the like.

The front end unit 730 includes a branch prediction unit 732 coupled to an instruction cache unit 734, which is coupled to an instruction translation lookaside buffer (TLB) 736, which is coupled to an instruction fetch unit 738, which is coupled to a decode unit 740. The decode unit 740 (or decoder) may decode instructions, and generate as an output one or more micro-operations, micro-code entry points, microinstructions, other instructions, or other control signals, which are decoded from, or which otherwise reflect, or are derived from, the original instructions. The decode unit 740 may be implemented using various different mechanisms. Examples of suitable mechanisms include, but are not limited to, look-up tables, hardware implementations, programmable logic arrays (PLAs), microcode read only memories (ROMs), etc. In one embodiment, the core 790 includes a microcode ROM or other medium that stores microcode for certain macroinstructions (e.g., in decode unit 740 or otherwise within the front end unit 730). The decode unit 740 is coupled to a rename/allocator unit 752 in the execution engine unit 750.

The execution engine unit 750 includes the rename/allocator unit 752 coupled to a retirement unit 754 and a set of one or more scheduler unit(s) 756. The scheduler unit(s) 756 represents any number of different schedulers, including reservations stations, central instruction window, etc. The scheduler unit(s) 756 is coupled to the physical register file(s) unit(s) 758. Each of the physical register file(s) units 758 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 758 comprises a vector registers unit and a scalar registers unit. These register units may provide architectural vector registers, vector mask registers, and general purpose registers. The physical register file(s) unit(s) 758 is overlapped by the retirement unit 754 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 754 and the physical register file(s) unit(s) 758 are coupled to the execution cluster(s) 760. The execution cluster(s) 760 includes a set of one or more execution units 762 and a set of one or more memory access units 764. The execution units 762 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 756, physical register file(s) unit(s) 758, and execution cluster(s) 760 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 764). It should also be understood that where separate pipelines are used, one or more of these pipelines may be out-of-order issue/execution and the rest in-order.

The set of memory access units 764 is coupled to the memory unit 770, which includes a data TLB unit 772 coupled to a data cache unit 774 coupled to a level 2 (L2) cache unit 776. In one exemplary embodiment, the memory access units 764 may include a load unit, a store address unit, and a store data unit, each of which is coupled to the data TLB unit 772 in the memory unit 770. The instruction cache unit 734 is further coupled to a level 2 (L2) cache unit 776 in the memory unit 770. The L2 cache unit 776 is coupled to one or more other levels of cache and eventually to a main memory.

By way of example, the exemplary register renaming, out-of-order issue/execution core architecture may implement the pipeline 700 as follows: 1) the instruction fetch 738 performs the fetch and length decoding stages 702 and 704; 2) the decode unit 740 performs the decode stage 706; 3) the rename/allocator unit 752 performs the allocation stage 708 and renaming stage 710; 4) the scheduler unit(s) 756 performs the schedule stage 712; 5) the physical register file(s) unit(s) 758 and the memory unit 770 perform the register read/memory read stage 714; the execution cluster 760 perform the execute stage 716; 6) the memory unit 770 and the physical register file(s) unit(s) 758 perform the write back/memory write stage 718; 7) various units may be involved in the exception handling stage 722; and 8) the retirement unit 754 and the physical register file(s) unit(s) 758 perform the commit stage 724.

The core 790 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 790 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 734/774 and a shared L2 cache unit 776, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 8B:
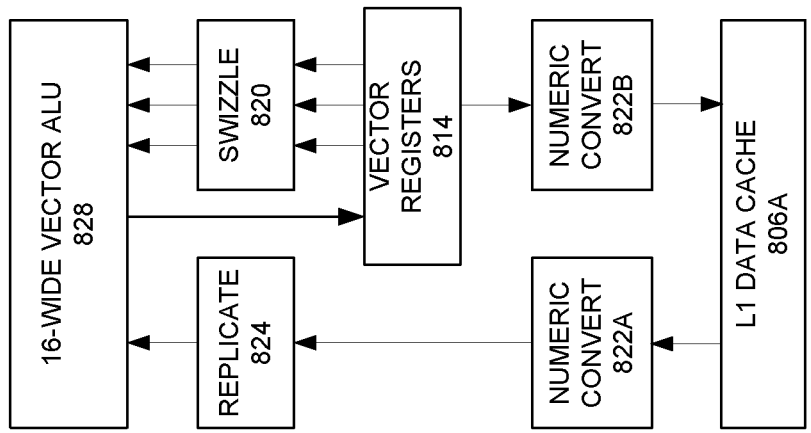
FIG. 8A-B illustrate a block diagram of a more specific exemplary in-order core architecture, which core would be one of several logic blocks (including other cores of the same type and/or different types) in a chip.
Figure 8A:
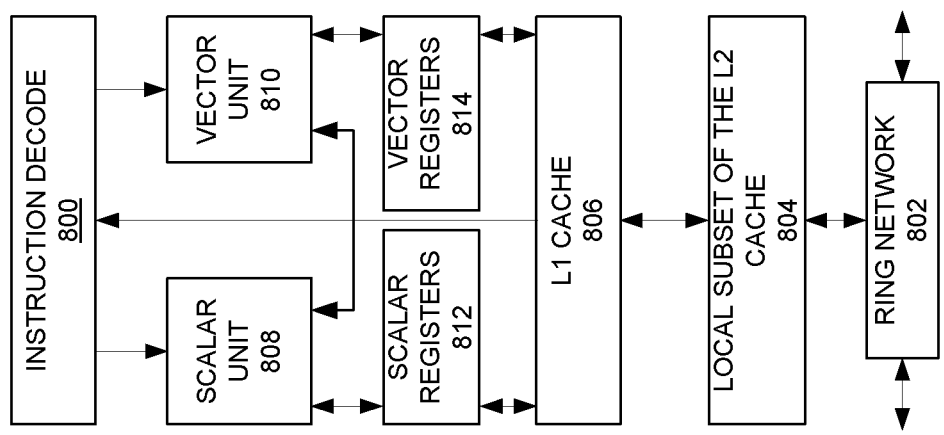

FIGS. 8A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 8A is a block diagram of a single processor core, along with its connection to the on-die interconnect network 802 and with its local subset of the Level 2 (L2) cache 804, according to embodiments of the invention. In one embodiment, an instruction decoder 800 supports the x86 instruction set with a packed data instruction set extension. An L1 cache 806 allows low-latency accesses to cache memory into the scalar and vector units. While in one embodiment (to simplify the design), a scalar unit 808 and a vector unit 810 use separate register sets (respectively, scalar registers 812 and vector registers 814) and data transferred between them is written to memory and then read back in from a level 1 (L1) cache 806, alternative embodiments of the invention may use a different approach (e.g., use a single register set or include a communication path that allow data to be transferred between the two register files without being written and read back).

The local subset of the L2 cache 804 is part of a global L2 cache that is divided into separate local subsets, one per processor core. Each processor core has a direct access path to its own local subset of the L2 cache 804. Data read by a processor core is stored in its L2 cache subset 804 and can be accessed quickly, in parallel with other processor cores accessing their own local L2 cache subsets. Data written by a processor core is stored in its own L2 cache subset 804 and is flushed from other subsets, if necessary. The ring network ensures coherency for shared data. The ring network is bi-directional to allow agents such as processor cores, L2 caches and other logic blocks to communicate with each other within the chip. Each ring data-path is 1024-bits wide per direction in some embodiments.

FIG. 8B is an expanded view of part of the processor core in FIG. 8A according to embodiments of the invention. FIG. 8B includes an L1 data cache 806A part of the L1 cache 804, as well as more detail regarding the vector unit 810 and the vector registers 814. Specifically, the vector unit 810 is a 9-wide vector processing unit (VPU) (see the 16-wide ALU 828), which executes one or more of integer, single-precision float, and double-precision float instructions. The VPU supports swizzling the register inputs with swizzle unit 820, numeric conversion with numeric convert units 822A-B, and replication with replication unit 824 on the memory input.

Processor with Integrated Memory Controller and Graphics

Figure 9:
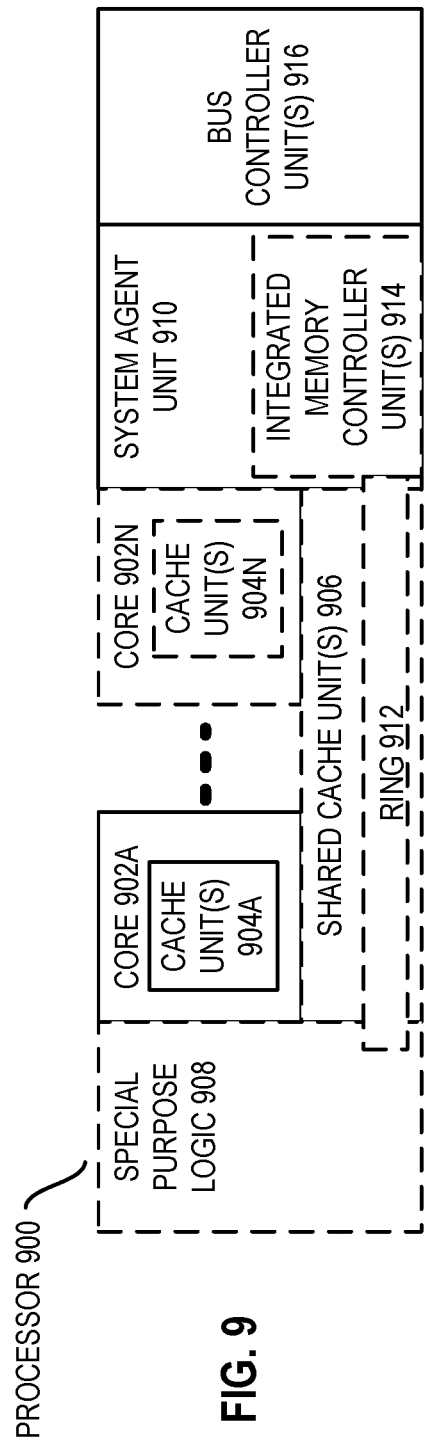
FIG. 9 is a block diagram of a processor that may have more than one core, may have an integrated memory controller, and may have integrated graphics according to embodiments of the invention.

FIG. 9 is a block diagram of a processor 900 that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores 904A-N, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the integrated graphics logic 908, the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multithreading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary Computer Architectures

FIGS. 10-13 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 10:
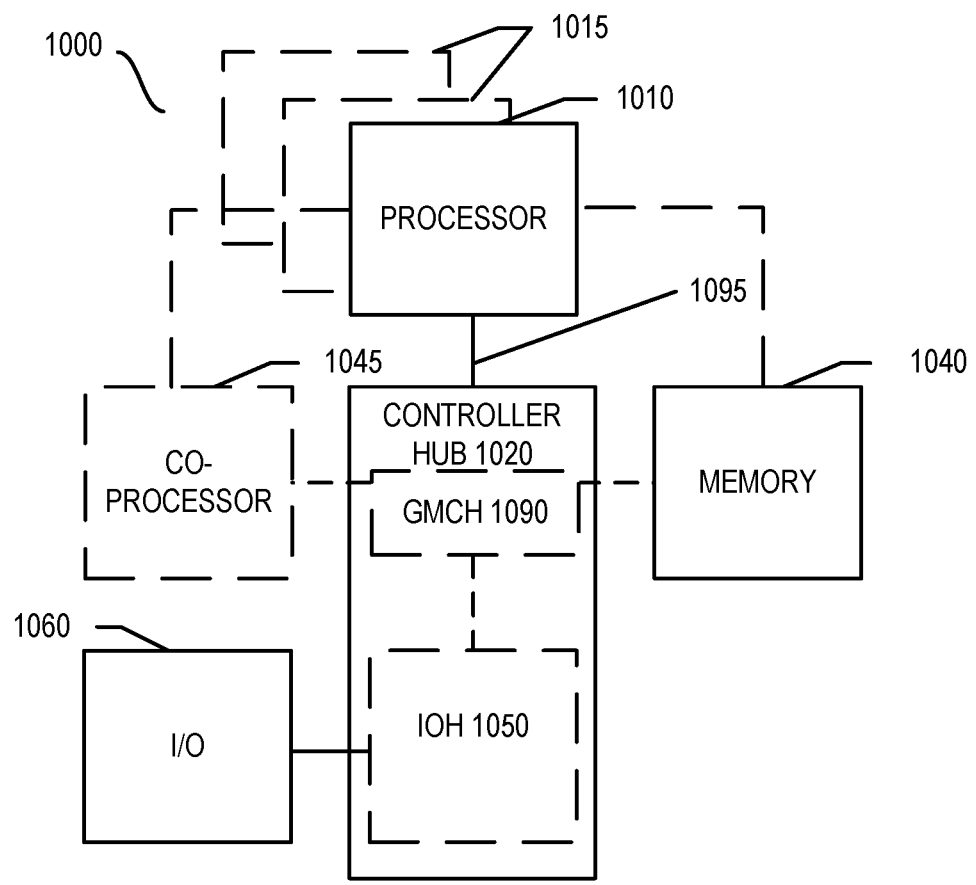
FIGS. 10-13 are block diagrams of exemplary computer architectures.

Referring now to FIG. 10, shown is a block diagram of a system 1000 in accordance with one embodiment of the present invention. The system 1000 may include one or more processors 1010, 1015, which are coupled to a controller hub 1020. In one embodiment, the controller hub 1020 includes a graphics memory controller hub (GMCH) 1090 and an Input/Output Hub (IOH) 1050 (which may be on separate chips); the GMCH 1090 includes memory and graphics controllers to which are coupled memory 1040 and a coprocessor 1045; the IOH 1050 is couples input/output (I/O) devices 1060 to the GMCH 1090. Alternatively, one or both of the memory and graphics controllers are integrated within the processor (as described herein), the memory 1040 and the coprocessor 1045 are coupled directly to the processor 1010, and the controller hub 1020 in a single chip with the IOH 1050.

The optional nature of additional processors 1015 is denoted in FIG. 10 with broken lines. Each processor 1010, 1015 may include one or more of the processing cores described herein and may be some version of the processor 900.

The memory 1040 may be, for example, dynamic random access memory (DRAM), phase change memory (PCM), or a combination of the two. For at least one embodiment, the controller hub 1020 communicates with the processor(s) 1010, 1015 via a multi-drop bus, such as a frontside bus (FSB), point-to-point interface, or similar connection 1095.

In one embodiment, the coprocessor 1045 is a special-purpose processor, such as, for example, a high-throughput MIC processor, a network or communication processor, compression engine, graphics processor, GPGPU, embedded processor, or the like. In one embodiment, controller hub 1020 may include an integrated graphics accelerator.

There can be a variety of differences between the physical resources 1010, 10155 in terms of a spectrum of metrics of merit including architectural, microarchitectural, thermal, power consumption characteristics, and the like.

In one embodiment, the processor 1010 executes instructions that control data processing operations of a general type. Embedded within the instructions may be coprocessor instructions. The processor 1010 recognizes these coprocessor instructions as being of a type that should be executed by the attached coprocessor 1045. Accordingly, the processor 1010 issues these coprocessor instructions (or control signals representing coprocessor instructions) on a coprocessor bus or other interconnect, to coprocessor 1045. Coprocessor(s) 1045 accept and execute the received coprocessor instructions.

Figure 11:
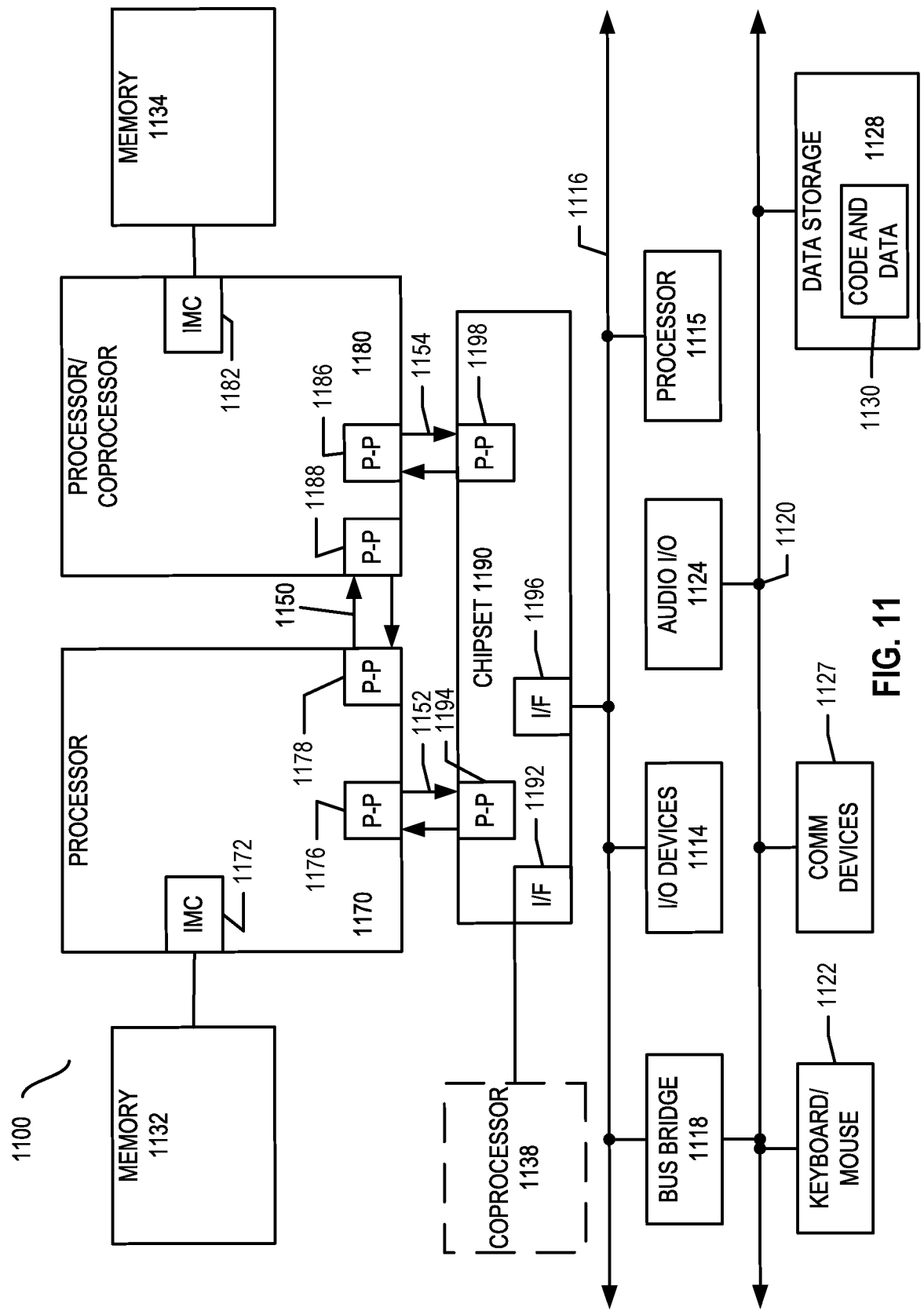

Referring now to FIG. 11, shown is a block diagram of a first more specific exemplary system 1100 in accordance with an embodiment of the present invention. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of the processor 900. In one embodiment of the invention, processors 1170 and 1180 are respectively processors 1010 and 1015, while coprocessor 1138 is coprocessor 1045. In another embodiment, processors 1170 and 1180 are respectively processor 1010 coprocessor 1045.

Processors 1170 and 1180 are shown including integrated memory controller (IMC) units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 may each exchange information with a chipset 1190 via individual P-P interfaces 1152, 1154 using point to point interface circuits 1176, 1194, 1186, 1198. Chipset 1190 may optionally exchange information with the coprocessor 1138 via a high-performance interface 1192. In one embodiment, the coprocessor 1138 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another I/O interconnect bus, although the scope of the present invention is not so limited.

As shown in FIG. 11, various I/O devices 1114 may be coupled to first bus 1116, along with a bus bridge 1118 which couples first bus 1116 to a second bus 1120. In one embodiment, one or more additional processor(s) 1115, such as coprocessors, high-throughput MIC processors, GPGPU's, accelerators (such as, e.g., graphics accelerators or digital signal processing (DSP) units), field programmable gate arrays, or any other processor, are coupled to first bus 1116. In one embodiment, second bus 1120 may be a low pin count (LPC) bus. Various devices may be coupled to a second bus 1120 including, for example, a keyboard and/or mouse 1122, communication devices 1127 and a storage unit 1128 such as a disk drive or other mass storage device which may include instructions/code and data 1130, in one embodiment. Further, an audio I/O 1124 may be coupled to the second bus 1116. Note that other architectures are possible. For example, instead of the point-to-point architecture of FIG. 11, a system may implement a multi-drop bus or other such architecture.

Figure 12:
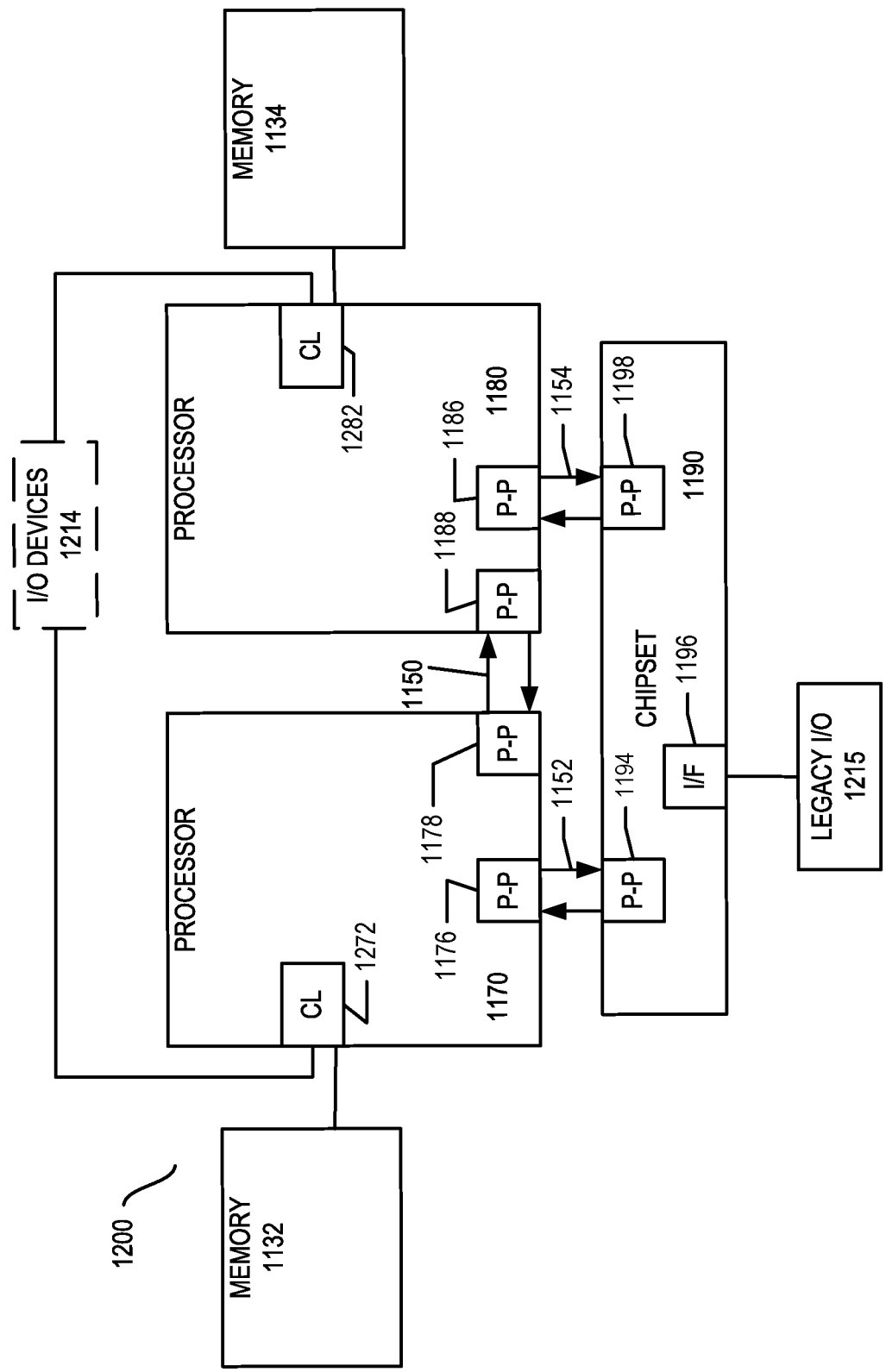

Referring now to FIG. 12, shown is a block diagram of a second more specific exemplary system 1200 in accordance with an embodiment of the present invention. Like elements in FIGS. 11 and 12 bear like reference numerals, and certain aspects of FIG. 11 have been omitted from FIG. 12 in order to avoid obscuring other aspects of FIG. 12.

FIG. 12 illustrates that the processors 1170, 1180 may include integrated memory and I/O control logic ("CL") 1272 and 1282, respectively. Thus, the CL 1272, 1282 include integrated memory controller units and include I/O control logic. FIG. 12 illustrates that not only are the memories 1132, 1134 coupled to the CL 1172, 1182, but also that I/O devices 1214 are also coupled to the control logic 1172, 1182. Legacy I/O devices 1215 are coupled to the chipset 1190.

Figure 13:
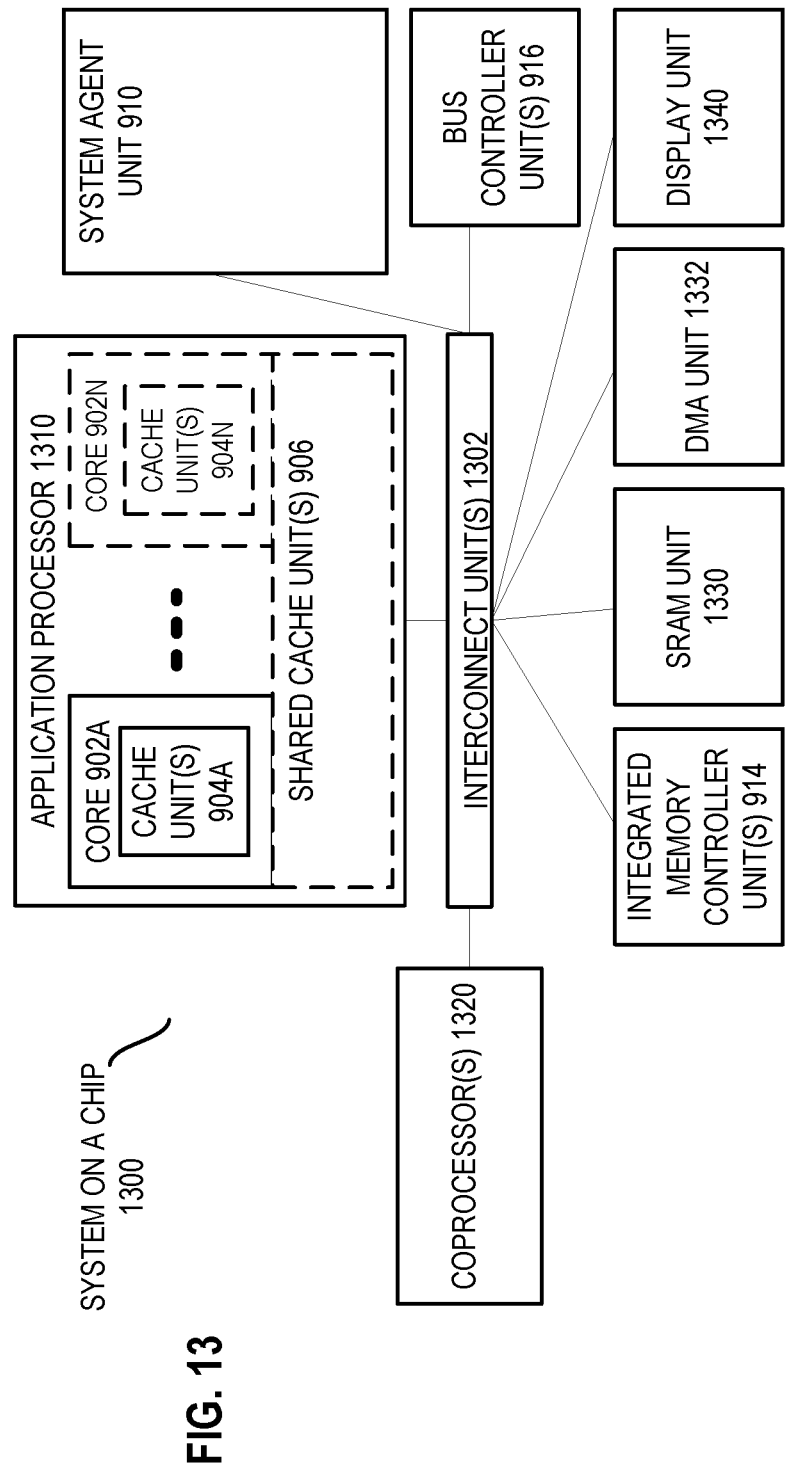

Referring now to FIG. 13, shown is a block diagram of a SoC 1300 in accordance with an embodiment of the present invention. Similar elements in FIG. 9 bear like reference numerals. Also, dashed lined boxes are optional features on more advanced SoCs. In FIG. 13, an interconnect unit(s) 1302 is coupled to: an application processor 1310 which includes a set of one or more cores 132A-N, cache units 904A-N, and shared cache unit(s) 906; a system agent unit 910; a bus controller unit(s) 916; an integrated memory controller unit(s) 914; a set or one or more coprocessors 1320 which may include integrated graphics logic, an image processor, an audio processor, and a video processor; an static random access memory (SRAM) unit 1330; a direct memory access (DMA) unit 1332; and a display unit 1340 for coupling to one or more external displays. In one embodiment, the coprocessor(s) 1320 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1130 illustrated in FIG. 11, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMS) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 14 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 14 shows a program in a high level language 1402 may be compiled using an first compiler 1404 to generate a first binary code (e.g., x86) 1406 that may be natively executed by a processor with at least one first instruction set core 1416. In some embodiments, the processor with at least one first instruction set core 1416 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The first compiler 1404 represents a compiler that is operable to generate binary code of the first instruction set 1406 (e.g., object code) that can, with or without additional linkage processing, be executed on the processor with at least one first instruction set core 1416. Similarly, FIG. 14 shows the program in the high level language 1402 may be compiled using an alternative instruction set compiler 1408 to generate alternative instruction set binary code 1410 that may be natively executed by a processor without at least one first instruction set core 1414 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1412 is used to convert the first binary code 1406 into code that may be natively executed by the processor without a first instruction set core 1414. This converted code is not likely to be the same as the alternative instruction set binary code 1410 because an instruction converter capable of this is difficult to make; however, the converted code will accomplish the general operation and be made up of instructions from the alternative instruction set. Thus, the instruction converter 1412 represents software, firmware, hardware, or a combination thereof that, through emulation, simulation or any other process, allows a processor or other electronic device that does not have a first instruction set processor or core to execute the first binary code 1406.

Examples of various embodiments are detailed below.

Example 1. A processor comprising: decode circuitry to decode an instruction having fields for an opcode, a packed data source operand identifier, and a packed data destination operand identifier; and execution circuitry to execute the decoded instruction to convert a single precision floating point data element of a least significant packed data element position of the identified packed data source operand to a fixed-point representation, store the fixed-point representation as 32-bit integer and a 32-bit integer exponent in the two least significant packed data element positions of the identified packed data destination operand, and zero of all remaining packed data elements of the identified packed data destination operand.

Example 2. The processor of example 1, wherein the integer component is stored in a least significant packed data element position of the identified packed data destination operand.

Example 3. The processor of example 2, wherein the execution circuitry is to: deconstruct the floating point value into sign, exponent, and fractional components, determine if the exponent component is 0, when the exponent component is 0, set the fixed-point integer and exponent components to zero, when the exponent component is not 0, determine if the exponent component is all ones, when the exponent component is all ones, determine if the most significant bit of the fractional component is 0, when the most significant bit of the fractional component is 0, determine if the sign is 0, when the sign is 0, set the fixed-point integer component to a value corresponding to hexadecimal 7fffffff and the exponent component to a value corresponding to hexadecimal 7fffffff, and when the sign is not 0, set the fixed-point integer component to a value corresponding to hexadecimal 8000000 and the exponent component to a value corresponding to hexadecimal 7fffffff, when the most significant bit of the fractional component is not 0, set the fixed-point integer component to h8000000 and the exponent component to h7fffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, generate the exponent component by concatenating 23 copies of the most significant bit of the temporary value with the temporary value, and store the integer and exponent components.

Example 4. The processor of example 1, wherein the exponent component is stored in a least significant packed data element position of the identified packed data destination operand.

Example 5. The processor of example 4, wherein the execution circuitry is to: deconstruct the floating point value into sign, exponent, and fractional components, determine if the exponent component is 0, when the exponent component is 0, set the fixed-point integer and exponent components to zero, when the exponent component is not 0, determine if the exponent component is all ones, when the exponent component is all ones, determine if the most significant bit of the fractional component is 0, when the most significant bit of the fractional component is 0, determine if the sign is 0, when the sign is 0, set the fixed-point integer component to a value corresponding to hexadecimal 7fffffff and the exponent component to a value corresponding to hexadecimal 7fffffff, and when the sign is not 0, set the fixed-point integer component to a value corresponding to hexadecimal 8000000 and the exponent component to a value corresponding to hexadecimal 7fffffff, when the most significant bit of the fractional component is not 0, set the fixed-point integer component to h8000000 and the exponent component to h7fffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, generate the exponent component by concatenating 23 copies of the most significant bit of the temporary value with the temporary value, and store the integer and exponent components.

Example 6. A method comprising: decoding an instruction having fields for an opcode, a packed data source operand identifier, and a packed data destination operand identifier; and executing the decoded instruction to convert a single precision floating point data element of a least significant packed data element position of the identified packed data source operand to a fixed-point representation, store the fixed-point representation as 32-bit integer and a 32-bit integer exponent in the two least significant packed data element positions of the identified packed data destination operand, and zero of all remaining packed data elements of the identified packed data destination operand.

Example 7. The method of example 6, wherein the integer component is stored in a least significant packed data element position of the identified packed data destination operand.

Example 8. The method of example 7, wherein the executing further comprises: deconstructing the floating point value into sign, exponent, and fractional components, determining if the exponent component is 0, when the exponent component is 0, setting the fixed-point integer and exponent components to zero, when the exponent component is not 0, determining if the exponent component is all ones, when the exponent component is all ones, determining if the most significant bit of the fractional component is 0, when the most significant bit of the fractional component is 0, determining if the sign is 0, when the sign is 0, setting the fixed-point integer component to a value corresponding to hexadecimal 7fffffff and the exponent component to a value corresponding to hexadecimal 7fffffff, and when the sign is not 0, setting the fixed-point integer component to a value corresponding to hexadecimal 8000000 and the exponent component to a value corresponding to hexadecimal 7fffffff, when the most significant bit of the fractional component is not 0, setting the fixed-point integer component to h8000000 and the exponent component to h7fffffff, and when the exponent component is not all ones or zeros, concatenating b000000001 with the fractional to generate an absolute value of the integer, determining if the sign is 0, when the sign is 0, setting the integer component as the absolute value of the integer, and when the sign is not 0, setting the integer component as the complement of the absolute value of the integer plus 1, and generating a temporary value by concatenating b0 with the exponent added to b101101010, generating the exponent component by concatenating 23 copies of the most significant bit of the temporary value with the temporary value, and storing the integer and exponent components.

Example 9. The method of example 6, wherein the exponent component is stored in a least significant packed data element position of the identified packed data destination operand.

Example 10. The method of example 9, wherein the executing further comprises: deconstructing the floating point value into sign, exponent, and fractional components, determining if the exponent component is 0, when the exponent component is 0, setting the fixed-point integer and exponent components to zero, when the exponent component is not 0, determining if the exponent component is all ones, when the exponent component is all ones, determining if the most significant bit of the fractional component is 0, when the most significant bit of the fractional component is 0, determining if the sign is 0, when the sign is 0, setting the fixed-point integer component to a value corresponding to hexadecimal 7fffffff and the exponent component to a value corresponding to hexadecimal 7fffffff, and when the sign is not 0, setting the fixed-point integer component to a value corresponding to hexadecimal 8000000 and the exponent component to a value corresponding to hexadecimal 7fffffff, when the most significant bit of the fractional component is not 0, setting the fixed-point integer component to h8000000 and the exponent component to h7fffffff, and when the exponent component is not all ones or zeros, concatenating b000000001 with the fractional to generate an absolute value of the integer, determining if the sign is 0, when the sign is 0, setting the integer component as the absolute value of the integer, and when the sign is not 0, setting the integer component as the complement of the absolute value of the integer plus 1, and generating a temporary value by concatenating b0 with the exponent added to b101101010, generating the exponent component by concatenating 23 copies of the most significant bit of the temporary value with the temporary value, and storing the integer and exponent components.

Example 11. A non-transitory machine-readable medium storing an instruction, wherein in response to the instruction, the processor to perform a method comprising: decoding an instruction having fields for an opcode, a packed data source operand identifier, and a packed data destination operand identifier; and executing the decoded instruction to convert a single precision floating point data element of a least significant packed data element position of the identified packed data source operand to a fixed-point representation, store the fixed-point representation as 32-bit integer and a 32-bit integer exponent in the two least significant packed data element positions of the identified packed data destination operand, and zero of all remaining packed data elements of the identified packed data destination operand.

Example 12. The non-transitory machine-readable medium of example 11, wherein the integer component is stored in a least significant packed data element position of the identified packed data destination operand.

Example 13. The non-transitory machine-readable medium of example 12, wherein the executing further comprises: deconstructing the floating point value into sign, exponent, and fractional components, determining if the exponent component is 0, when the exponent component is 0, setting the fixed-point integer and exponent components to zero, when the exponent component is not 0, determining if the exponent component is all ones, when the exponent component is all ones, determining if the most significant bit of the fractional component is 0, when the most significant bit of the fractional component is 0, determining if the sign is 0, when the sign is 0, setting the fixed-point integer component to a value corresponding to hexadecimal 7fffffff and the exponent component to a value corresponding to hexadecimal 7fffffff, and when the sign is not 0, setting the fixed-point integer component to a value corresponding to hexadecimal 8000000 and the exponent component to a value corresponding to hexadecimal 7fffffff, when the most significant bit of the fractional component is not 0, setting the fixed-point integer component to h8000000 and the exponent component to h7fffffff, and when the exponent component is not all ones or zeros, concatenating b000000001 with the fractional to generate an absolute value of the integer, determining if the sign is 0, when the sign is 0, setting the integer component as the absolute value of the integer, and when the sign is not 0, setting the integer component as the complement of the absolute value of the integer plus 1, and generating a temporary value by concatenating b0 with the exponent added to b101101010, generating the exponent component by concatenating 23 copies of the most significant bit of the temporary value with the temporary value, and storing the integer and exponent components.

Example 16. A processor comprising: decoding means for decoding an instruction having fields for an opcode, a packed data source operand identifier, and a packed data destination operand identifier; and execution means for executing the decoded instruction to convert a single precision floating point data element of a least significant packed data element position of the identified packed data source operand to a fixed-point representation, store the fixed-point representation as 32-bit integer and a 32-bit integer exponent in the two least significant packed data element positions of the identified packed data destination operand, and zero of all remaining packed data elements of the identified packed data destination operand.

Example 17. The apparatus of example 16, wherein the integer component is stored in a least significant packed data element position of the identified packed data destination operand.

Example 18. The apparatus of example 17, wherein the execution means is to: deconstruct the floating point value into sign, exponent, and fractional components, determine if the exponent component is 0, when the exponent component is 0, set the fixed-point integer and exponent components to zero, when the exponent component is not 0, determine if the exponent component is all ones, when the exponent component is all ones, determine if the most significant bit of the fractional component is 0, when the most significant bit of the fractional component is 0, determine if the sign is 0, when the sign is 0, set the fixed-point integer component to a value corresponding to hexadecimal 7fffffff and the exponent component to a value corresponding to hexadecimal 7fffffff, and when the sign is not 0, set the fixed-point integer component to a value corresponding to hexadecimal 8000000 and the exponent component to a value corresponding to hexadecimal 7fffffff, when the most significant bit of the fractional component is not 0, set the fixed-point integer component to h8000000 and the exponent component to h7fffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, generate the exponent component by concatenating 23 copies of the most significant bit of the temporary value with the temporary value, and store the integer and exponent components.

Example 19. The apparatus of example 16, wherein the exponent component is stored in a least significant packed data element position of the identified packed data destination operand.

Example 20. The apparatus of example 19, wherein the execution means is to: deconstruct the floating point value into sign, exponent, and fractional components, determine if the exponent component is 0, when the exponent component is 0, set the fixed-point integer and exponent components to zero, when the exponent component is not 0, determine if the exponent component is all ones, when the exponent component is all ones, determine if the most significant bit of the fractional component is 0, when the most significant bit of the fractional component is 0, determine if the sign is 0, when the sign is 0, set the fixed-point integer component to a value corresponding to hexadecimal 7fffffff and the exponent component to a value corresponding to hexadecimal 7fffffff, and when the sign is not 0, set the fixed-point integer component to a value corresponding to hexadecimal 8000000 and the exponent component to a value corresponding to hexadecimal 7fffffff, when the most significant bit of the fractional component is not 0, set the fixed-point integer component to h8000000 and the exponent component to h7fffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, generate the exponent component by concatenating 23 copies of the most significant bit of the temporary value with the temporary value, and store the integer and exponent components.

We claim:

1. A processor comprising:
   decode circuitry to decode an instruction having fields for an opcode to indicate to execution circuitry to convert a floating point data element of a first packed data source to a fixed-point representation, a packed data source operand identifier, and a packed data destination operand identifier; and
   execution circuitry to execute the decoded instruction to:
     convert the floating point data element of the identified packed data source operand to a fixed-point representation, and
     store the fixed-point representation as an integer component and a exponent component in two packed data element positions of the identified packed data destination operand.

2. The processor of claim 1, wherein the integer component is to be stored in a least significant packed data element position of the identified packed data destination operand.

3. The processor of claim 2, wherein to convert the floating point data element of the identified packed data source operand to a fixed-point representation the execution circuitry is to:
   deconstruct the floating point value into sign, exponent, and fractional components,
   determine if the exponent component is 0,
   when the exponent component is 0, set the fixed-point integer and exponent components to zero,
   when the exponent component is not 0, determine if the exponent component is all ones,
   when the exponent component is all ones,
     determine if the most significant bit of the fractional component is 0,
       when the most significant bit of the fractional component is 0, determine if the sign is 0,
         when the sign is 0, set the fixed-point integer component to a value corresponding to hexadecimal 7fffffff and the exponent component to a value corresponding to hexadecimal 7fffffff, and
         when the sign is not 0, set the fixed-point integer component to a value corresponding to hexadecimal 8000000 and the exponent component to a value corresponding to hexadecimal 7fffffff,
       when the most significant bit of the fractional component is not 0, set the fixed-point integer component to h8000000 and the exponent component to h7fffffff, and
   when the exponent component is not all ones or zeros,
     concatenate b000000001 with the fractional to generate an absolute value of the integer,
     determine if the sign is 0,
       when the sign is 0 set the integer component as the absolute value of the integer, and
       when the sign is not 0 set the integer component as the complement of the absolute value of the integer plus 1, and
     generate a temporary value by concatenating b0 with the exponent added to b101101010, and
     generate the exponent component by concatenating 23 copies of the most significant bit of the temporary value with the temporary value.

4. The processor of claim 1, wherein the exponent component is stored in a least significant packed data element position of the identified packed data destination operand.

5. The processor of claim 4, wherein the to convert the floating point data element of the identified packed data source operand to a fixed-point representation execution circuitry is to:
   deconstruct the floating point value into sign, exponent, and fractional components,
   determine if the exponent component is 0,
   when the exponent component is 0, set the fixed-point integer and exponent components to zero,
   when the exponent component is not 0, determine if the exponent component is all ones,
   when the exponent component is all ones,
     determine if the most significant bit of the fractional component is 0,
       when the most significant bit of the fractional component is 0, determine if the sign is 0,
         when the sign is 0, set the fixed-point integer component to a value corresponding to hexadecimal 7fffffff and the exponent component to a value corresponding to hexadecimal 7fffffff, and
         when the sign is not 0, set the fixed-point integer component to a value corresponding to hexadecimal 8000000 and the exponent component to a value corresponding to hexadecimal 7fffffff, when the most significant bit of the fractional component is not 0, set the fixed-point integer component to h8000000 and the exponent component to h7fffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, and generate the exponent component by concatenating 23 copies of the most significant bit of the temporary value with the temporary value.

6. The processor of claim 1, wherein the opcode mnemonic is VCTFSS2D.

7. A method comprising:

decoding an instruction having fields for an opcode indicating that the execution of the decoded instruction is to cause a conversion of a floating point data element of a first packed data source to a fixed-point representation, a packed data source operand identifier, and a packed data destination operand identifier; and executing the decoded instruction to:

convert the floating point data element of the identified packed data source operand to a fixed-point representation, and store the fixed-point representation as an integer component and a bit integer exponent component in of the identified packed data destination operand.

8. The method of claim 7, wherein the integer component is stored in a least significant packed data element position of the identified packed data destination operand.

9. The method of claim 8, wherein the executing further comprises:

deconstructing the floating point value into sign, exponent, and fractional components, determining if the exponent component is 0, when the exponent component is 0, setting the fixed-point integer and exponent components to zero, when the exponent component is not 0, determining if the exponent component is all ones, when the exponent component is all ones, determining if the most significant bit of the fractional component is 0, when the most significant bit of the fractional component is 0, determining if the sign is 0, when the sign is 0, setting the fixed-point integer component to a value corresponding to hexadecimal 7ffffff and the exponent component to a value corresponding to hexadecimal 7fffffff, when the sign is not 0, setting the fixed-point integer component to a value corresponding to hexadecimal 8000000 and the exponent component to a value corresponding to hexadecimal 7fffffff, when the most significant bit of the fractional component is not 0, setting the fixed-point integer component to h8000000 and the exponent component to h7fffffff, and when the exponent component is not all ones or zeros, concatenating b000000001 with the fractional to generate an absolute value of the integer, determining if the sign is 0, when the sign is 0, setting the integer component as the absolute value of the integer, and when the sign is not 0, setting the integer component as the complement of the absolute value of the integer plus 1, and generating a temporary value by concatenating b0 with the exponent added to b101101010, and generating the exponent component by concatenating 23 copies of the most significant bit of the temporary value with the temporary value.

10. The method of claim 7, wherein the exponent component is stored in a least significant packed data element position of the identified packed data destination operand.

11. The method of claim 10, wherein the executing further comprises:

deconstructing the floating point value into sign, exponent, and fractional components, determining if the exponent component is 0, when the exponent component is 0, setting the fixed-point integer and exponent components to zero, when the exponent component is not 0, determining if the exponent component is all ones, when the exponent component is all ones, determining if the most significant bit of the fractional component is 0, when the most significant bit of the fractional component is 0, determining if the sign is 0, when the sign is 0, setting the fixed-point integer component to a value corresponding to hexadecimal 7ffffff and the exponent component to a value corresponding to hexadecimal 7fffffff, and when the sign is not 0, setting the fixed-point integer component to a value corresponding to hexadecimal 8000000 and the exponent component to a value corresponding to hexadecimal 7fffffff, when the most significant bit of the fractional component is not 0, setting the fixed-point integer component to h8000000 and the exponent component to h7fffffff, and when the exponent component is not all ones or zeros, concatenating b000000001 with the fractional to generate an absolute value of the integer, determining if the sign is 0, when the sign is 0, setting the integer component as the absolute value of the integer, and when the sign is not 0, setting the integer component as the complement of the absolute value of the integer plus 1, and generating a temporary value by concatenating b0 with the exponent added to b101101010, generating the exponent component by concatenating 23 copies of the most significant bit of the temporary value with the temporary value.

12. A non-transitory machine-readable medium storing an instruction, wherein in response to the instruction, the processor to perform a method comprising:

decoding the instruction having fields for an opcode indicating that the execution of the decoded instruction is to cause a conversion of a floating point data element of a first packed data source to a fixed-point representation, a packed data source operand identifier, and a packed data destination operand identifier; and executing the decoded instruction to convert the floating point data element of the identified packed data source operand to a fixed-point representation, and store the fixed-point representation as an integer component and a integer exponent component in the identified packed data destination operand.

13. The non-transitory machine-readable medium of claim 12, wherein the integer component is stored in a least significant packed data element position of the identified packed data destination operand.

14. The non-transitory machine-readable medium of claim 13, wherein the executing further comprises:
deconstructing the floating point value into sign, exponent, and fractional components,
determining if the exponent component is 0,
when the exponent component is 0, setting the fixed-point integer and exponent components to zero,
when the exponent component is not 0, determining if the exponent component is all ones,
when the exponent component is all ones,
determining if the most significant bit of the fractional component is 0,
when the most significant bit of the fractional component is 0, determining if the sign is 0,
when the sign is 0, setting the fixed-point integer component to a value corresponding to hexadecimal 7fffffff and the exponent component to a value corresponding to hexadecimal 7fffffff, and
when the sign is not 0, setting the fixed-point integer component to a value corresponding to hexadecimal 8000000 and the exponent component to a value corresponding to hexadecimal 7fffffff,
when the most significant bit of the fractional component is not 0, setting the fixed-point integer component to h8000000 and the exponent component to h7fffffff, and
when the exponent component is not all ones or zeros, concatenating b000000001 with the fractional to generate an absolute value of the integer,
determining if the sign is 0,
when the sign is 0, setting the integer component as the absolute value of the integer, and
when the sign is not 0, setting the integer component as the complement of the absolute value of the integer plus 1, and
generating a temporary value by concatenating b0 with the exponent added to b101101010, and
generating the exponent component by concatenating 23 copies of the most significant bit of the temporary value with the temporary value.

15. The non-transitory machine-readable medium of claim 12, wherein the exponent component is stored in a least significant packed data element position of the identified packed data destination operand.

16. The non-transitory machine-readable medium of claim 15, wherein the executing further comprises:
deconstructing the floating point value into sign, exponent, and fractional components,
determining if the exponent component is 0,
when the exponent component is 0, setting the fixed-point integer and exponent components to zero,
when the exponent component is not 0, determining if the exponent component is all ones,
when the exponent component is all ones,
determining if the most significant bit of the fractional component is 0,
when the most significant bit of the fractional component is 0, determining if the sign is 0,
when the sign is 0, setting the fixed-point integer component to a value corresponding to hexadecimal 7fffffff and the exponent component to a value corresponding to hexadecimal 7fffffff, and
when the sign is not 0, setting the fixed-point integer component to a value corresponding to hexadecimal 8000000 and the exponent component to a value corresponding to hexadecimal 7fffffff,
when the most significant bit of the fractional component is not 0, setting the fixed-point integer component to h8000000 and the exponent component to h7fffffff, and
when the exponent component is not all ones or zeros, concatenating b000000001 with the fractional to generate an absolute value of the integer,
determining if the sign is 0,
when the sign is 0, setting the integer component as the absolute value of the integer, and
when the sign is not 0, setting the integer component as the complement of the absolute value of the integer plus 1, and
generating a temporary value by concatenating b0 with the exponent added to b101101010, and
generating the exponent component by concatenating 23 copies of the most significant bit of the temporary value with the temporary value.

17. A processor comprising:
decoding means for decoding an instruction having fields for an opcode opcode to indicate to execution means to convert a floating point data element of a first packed data source to a fixed-point representation, a packed data source operand identifier, and a packed data destination operand identifier; and
execution means for executing the decoded instruction to:
convert the floating point data element the identified packed data source operand to a fixed-point representation, and
store the fixed-point representation as an integer component and an integer exponent component in the identified packed data destination operand.

18. The apparatus of claim 17, wherein the integer component is stored in a least significant packed data element position of the identified packed data destination operand.

19. The apparatus of claim 18, wherein the execution means is to:
deconstruct the floating point value into sign, exponent, and fractional components,
determine if the exponent component is 0,
when the exponent component is 0, set the fixed-point integer and exponent components to zero,
when the exponent component is not 0, determine if the exponent component is all ones,
when the exponent component is all ones,
determine if the most significant bit of the fractional component is 0,
when the most significant bit of the fractional component is 0, determine if the sign is 0,
when the sign is 0, set the fixed-point integer component to a value corresponding to hexadecimal 7fffffff and the exponent component to a value corresponding to hexadecimal 7ffffff, and when the sign is not 0, set the fixed-point integer component to a value corresponding to hexadecimal 8000000 and the exponent component to a value corresponding to hexadecimal 7ffffff, when the most significant bit of the fractional component is not 0, set the fixed-point integer component to h8000000 and the exponent component to h7ffffff, and when the exponent component is not all ones or zeros, concatenate b000000001 with the fractional to generate an absolute value of the integer, determine if the sign is 0, when the sign is 0 set the integer component as the absolute value of the integer, and when the sign is not 0 set the integer component as the complement of the absolute value of the integer plus 1, and generate a temporary value by concatenating b0 with the exponent added to b101101010, generate the exponent component by concatenating 23 copies of the most significant bit of the temporary value with the temporary value.

20. The apparatus of claim 17, wherein the exponent component is stored in a least significant packed data element position of the identified packed data destination operand.

* * * * *